United States Patent
Kumar et al.

(10) Patent No.: US 7,494,904 B2
(45) Date of Patent: Feb. 24, 2009

(54) PLASMA-ASSISTED DOPING

(75) Inventors: Satyendra Kumar, Troy, MI (US); Devendra Kumar, Rochester Hills, MI (US)

(73) Assignee: BTU International, Inc., N. Billerica, MA (US)

( * ) Notice: Subject to any disclaimer, the term of this patent is extended or adjusted under 35 U.S.C. 154(b) by 602 days.

(21) Appl. No.: 10/513,397

(22) PCT Filed: May 7, 2003

(86) PCT No.: PCT/US03/14130

§ 371 (c)(1), (2), (4) Date: Aug. 5, 2005

(87) PCT Pub. No.: WO03/095591

PCT Pub. Date: Nov. 20, 2003

(65) Prior Publication Data

US 2006/0063361 A1 Mar. 23, 2006

Related U.S. Application Data

(60) Provisional application No. 60/435,278, filed on Dec. 23, 2002, provisional application No. 60/430,677, filed on Dec. 4, 2002, provisional application No. 60/378,693, filed on May 8, 2002.

(51) Int. Cl.
*H01L 21/26* (2006.01)
*H01L 21/42* (2006.01)
(52) U.S. Cl. ............... 438/510; 438/513; 257/E21.143
(58) Field of Classification Search ............... 438/510; 257/E21.143
See application file for complete search history.

(56) References Cited

U.S. PATENT DOCUMENTS

| 3,432,296 | A | 3/1969 | McKinnon et al. |
| 3,612,686 | A | 10/1971 | Braman |
| 3,731,047 | A | 5/1973 | Mullen et al. |
| 4,004,934 | A | 1/1977 | Prochazka |
| 4,025,818 | A | 5/1977 | Giguere |
| 4,090,055 | A | 5/1978 | King |

(Continued)

FOREIGN PATENT DOCUMENTS

DE 222 348 A1 5/1985

(Continued)

OTHER PUBLICATIONS

Accentus—http://www.accentus.co.uk/ipco/html/techenv6_txt_fr.html.

(Continued)

*Primary Examiner*—Marcos D. Pizarro
*Assistant Examiner*—Igwe U. Anya
(74) *Attorney, Agent, or Firm*—Weingarten, Schurgin, Gagnebin & Lebovici LLP

(57) ABSTRACT

Methods and apparatus are provided for igniting, modulating, and sustaining a plasma for various doping processes. In one embodiment, a substrate (250) can be doped by forming a plasma (610) in a cavity (285) by subjecting a gas to an amount of electromagnetic radiation in the presence of a plasma catalyst (240) and adding at least one dopant material to the plasma. The material is then allowed to penetrate into the substrate. Various active and passive catalysts are provided.

54 Claims, 9 Drawing Sheets

U.S. PATENT DOCUMENTS

| | | |
|---|---|---|
| 4,147,911 A | 4/1979 | Nishitani |
| 4,151,034 A | 4/1979 | Yamamoto et al. |
| 4,213,818 A | 7/1980 | Lemons et al. |
| 4,230,448 A | 10/1980 | Ward et al. |
| 4,265,730 A | 5/1981 | Hirose et al. |
| 4,307,277 A | 12/1981 | Maeda et al. |
| 4,339,326 A | 7/1982 | Hirose et al. |
| 4,404,456 A | 9/1983 | Cann |
| 4,473,736 A | 9/1984 | Bloyet et al. |
| 4,479,075 A | 10/1984 | Elliott |
| 4,500,564 A | 2/1985 | Enomoto |
| 4,504,007 A | 3/1985 | Anderson, Jr. |
| 4,609,808 A | 9/1986 | Bloyet et al. |
| 4,611,108 A | 9/1986 | Leprince et al. |
| 4,624,738 A | 11/1986 | Westfall et al. |
| 4,664,937 A | 5/1987 | Ovshinsky et al. |
| 4,666,775 A | 5/1987 | Kim et al. |
| 4,687,560 A | 8/1987 | Tracy |
| 4,698,234 A | 10/1987 | Ovshinsky et al. |
| 4,760,230 A | 7/1988 | Hassler |
| 4,767,902 A | 8/1988 | Palaith |
| 4,772,770 A | 9/1988 | Matsui |
| 4,792,348 A | 12/1988 | Pekarsky |
| 4,840,139 A | 6/1989 | Takei |
| 4,871,581 A | 10/1989 | Yamazaki |
| 4,877,589 A | 10/1989 | O'Hare |
| 4,877,938 A | 10/1989 | Rau et al. |
| 4,883,570 A | 11/1989 | Efthimion et al. |
| 4,888,088 A | 12/1989 | Slomowitz |
| 4,891,488 A | 1/1990 | Davis |
| 4,897,285 A | 1/1990 | Wilhelm |
| 4,908,492 A | 3/1990 | Okamoto et al. |
| 4,919,077 A | 4/1990 | Oda |
| 4,924,061 A | 5/1990 | Labat |
| 4,946,547 A | 8/1990 | Palmour |
| 4,956,590 A | 9/1990 | Phillips |
| 4,963,709 A | 10/1990 | Kimrey |
| 4,972,799 A | 11/1990 | Misumi |
| 5,003,125 A | 3/1991 | Giusti |
| 5,003,152 A | 3/1991 | Matsuo et al. |
| 5,010,220 A | 4/1991 | Apte |
| 5,017,404 A | 5/1991 | Paquet |
| 5,023,056 A | 6/1991 | Aklufi |
| 5,058,527 A | 10/1991 | Ohta et al. |
| 5,072,650 A | 12/1991 | Phillips |
| 5,074,112 A | 12/1991 | Walton |
| 5,085,885 A * | 2/1992 | Foley et al. ............... 427/575 |
| 5,087,272 A | 2/1992 | Nixdorf |
| 5,103,715 A | 4/1992 | Phillips |
| 5,120,567 A | 6/1992 | Frind et al. |
| 5,122,633 A | 6/1992 | Moshammer |
| 5,131,993 A | 7/1992 | Suib et al. |
| 5,164,130 A | 11/1992 | Holcombe |
| 5,202,541 A | 4/1993 | Patterson |
| 5,222,448 A | 6/1993 | Morgenthaler et al. |
| 5,223,308 A | 6/1993 | Doehler |
| 5,224,117 A | 6/1993 | Kruger et al. |
| 5,227,695 A | 7/1993 | Pelletier |
| 5,271,963 A | 12/1993 | Elchman et al. |
| 5,276,297 A | 1/1994 | Nara |
| 5,276,386 A | 1/1994 | Watanabe |
| 5,277,773 A | 1/1994 | Murphy |
| 5,284,544 A | 2/1994 | Mizutani et al. |
| 5,304,766 A | 4/1994 | Baudet et al. |
| 5,307,892 A | 5/1994 | Phillips |
| 5,310,426 A | 5/1994 | Mori |
| 5,311,906 A | 5/1994 | Phillips |
| 5,316,043 A | 5/1994 | Phillips |
| 5,321,223 A | 6/1994 | Kimrey |
| 5,349,154 A | 9/1994 | Harker et al. |
| 5,366,764 A | 11/1994 | Sunthankar |
| 5,370,525 A | 12/1994 | Godon |
| 5,423,180 A | 6/1995 | Nobue et al. |
| 5,435,698 A | 7/1995 | Phillips |
| 5,449,887 A | 9/1995 | Holcombe |
| 5,489,550 A * | 2/1996 | Moslehi ............... 438/565 |
| 5,505,275 A | 4/1996 | Phillips |
| 5,514,217 A | 5/1996 | Niino |
| 5,520,740 A | 5/1996 | Kanai |
| 5,521,360 A | 5/1996 | Johnson et al. |
| 5,523,126 A | 6/1996 | Sano |
| 5,527,391 A | 6/1996 | Echizen et al. |
| 5,536,477 A | 7/1996 | Cha et al. |
| 5,597,456 A | 1/1997 | Maruyama et al. |
| 5,607,509 A | 3/1997 | Schumacher |
| 5,616,373 A | 4/1997 | Karner |
| 5,645,897 A | 7/1997 | Andra |
| 5,651,825 A | 7/1997 | Nakahigashi et al. |
| 5,662,965 A | 9/1997 | Deguchi |
| 5,670,065 A | 9/1997 | Bickmann |
| 5,671,045 A | 9/1997 | Woskov |
| 5,682,745 A | 11/1997 | Phillips |
| 5,689,949 A | 11/1997 | DeFreitas |
| 5,712,000 A | 1/1998 | Wei et al. |
| 5,714,010 A | 2/1998 | Matsuyama et al. |
| 5,715,677 A | 2/1998 | Wallman et al. |
| 5,734,501 A | 3/1998 | Smith |
| 5,735,451 A | 4/1998 | Mori |
| 5,741,364 A | 4/1998 | Kodama |
| 5,755,097 A | 5/1998 | Phillips |
| 5,794,113 A | 8/1998 | Munir et al. |
| 5,796,080 A | 8/1998 | Jennings |
| 5,808,282 A | 9/1998 | Apte |
| 5,828,338 A | 10/1998 | Gerstenberg |
| 5,841,237 A | 11/1998 | Alton |
| 5,847,355 A | 12/1998 | Barmatz et al. |
| 5,848,348 A | 12/1998 | Dennis |
| 5,859,404 A | 1/1999 | Wei |
| 5,868,871 A | 2/1999 | Yokose et al. |
| 5,874,705 A * | 2/1999 | Duan ............... 219/121.43 |
| 5,904,993 A | 5/1999 | Takeuchi |
| 5,939,026 A | 8/1999 | Seki et al. |
| 5,945,351 A | 8/1999 | Mathuni |
| 5,961,773 A | 10/1999 | Ichimura et al. |
| 5,961,871 A | 10/1999 | Bible et al. |
| 5,973,289 A | 10/1999 | Read et al. |
| 5,976,429 A | 11/1999 | Chen |
| 5,980,843 A | 11/1999 | Silversand |
| 5,980,999 A | 11/1999 | Goto et al. |
| 5,989,477 A | 11/1999 | Berger |
| 5,993,612 A | 11/1999 | Rostaing et al. |
| 5,998,774 A | 12/1999 | Joines et al. |
| 6,011,248 A | 1/2000 | Dennis |
| 6,028,393 A | 2/2000 | Izu |
| 6,038,854 A | 3/2000 | Penetrante et al. |
| 6,054,693 A | 4/2000 | Barmatz et al. |
| 6,054,700 A | 4/2000 | Rokhvarger |
| 6,096,389 A | 8/2000 | Kanai |
| 6,101,969 A | 8/2000 | Niori |
| 6,103,068 A | 8/2000 | Merten et al. |
| 6,122,912 A | 9/2000 | Phillips |
| 6,131,386 A | 10/2000 | Trumble |
| 6,132,550 A | 10/2000 | Shiomi |
| 6,149,985 A | 11/2000 | Grace et al. |
| 6,152,254 A | 11/2000 | Phillips |
| 6,153,868 A | 11/2000 | Marzat |
| 6,183,689 B1 | 2/2001 | Roy et al. |
| 6,186,090 B1 | 2/2001 | Dotter |
| 6,189,482 B1 | 2/2001 | Zhao |
| 6,204,606 B1 | 3/2001 | Spence |
| 6,224,836 B1 | 5/2001 | Moisan et al. |
| 6,228,773 B1 | 5/2001 | Cox |
| 6,238,629 B1 | 5/2001 | Barankova et al. |
| 6,248,206 B1 | 6/2001 | Herchen et al. |

| | | | | | | |
|---|---|---|---|---|---|---|
| 6,264,812 | B1 | 7/2001 | Raaijmakers et al. | EP | 1 093 846 A1 | 4/2001 |
| 6,284,202 | B1 | 9/2001 | Cha et al. | EP | 1 427 265 A2 | 6/2004 |
| 6,287,980 | B1 | 9/2001 | Hanazaki et al. | JP | 56-140021 A2 | 11/1981 |
| 6,287,988 | B1 | 9/2001 | Nagamine et al. | JP | 57-119164 A2 | 7/1982 |
| 6,297,172 | B1 | 10/2001 | Kashiwagi | JP | 58-025073 A | 2/1983 |
| 6,297,595 | B1 | 10/2001 | Stimson | JP | 59-169053 A | 9/1984 |
| 6,329,628 | B1 | 12/2001 | Kuo | JP | 62-000535 A | 1/1987 |
| 6,342,195 | B1 | 1/2002 | Roy et al. | JP | 04-74858 A | 3/1992 |
| 6,345,497 | B1 | 2/2002 | Penetrante et al. | JP | 06-345541 A | 12/1994 |
| 6,348,158 | B1 | 2/2002 | Samukawa | JP | 07-153405 A | 6/1995 |
| 6,358,361 | B1 | 3/2002 | Matsumoto | JP | 09-235686 A | 2/1996 |
| 6,362,449 | B1 | 3/2002 | Hadidi | JP | 08-217558 A | 8/1996 |
| 6,365,885 | B1 | 4/2002 | Roy et al. | JP | 08-281423 A | 10/1996 |
| 6,367,412 | B1 * | 4/2002 | Ramaswamy et al. ..... 118/723 I | JP | 09-017597 A | 1/1997 |
| 6,370,459 | B1 | 4/2002 | Phillips | JP | 09-023458 A | 1/1997 |
| 6,372,304 | B1 | 4/2002 | Sano et al. | JP | 09-027459 A | 1/1997 |
| 6,376,027 | B1 | 4/2002 | Lee et al. | JP | 09-027482 A | 1/1997 |
| 6,383,333 | B1 | 5/2002 | Haino et al. | JP | 09-078240 A | 3/1997 |
| 6,383,576 | B1 | 5/2002 | Matsuyama | JP | 09-102400 A | 4/1997 |
| 6,388,225 | B1 | 5/2002 | Blum et al. | JP | 09-102488 A | 4/1997 |
| 6,392,350 | B1 | 5/2002 | Amano | JP | 09-111461 A | 4/1997 |
| 6,407,359 | B1 | 6/2002 | Lagarde et al. | JP | 09-137274 A | 5/1997 |
| 6,488,112 | B1 | 12/2002 | Kleist | JP | 09-157048 A | 6/1997 |
| 6,512,216 | B2 | 1/2003 | Gedevanishvill et al. | JP | 09-223596 A | 8/1997 |
| 6,522,055 | B2 | 2/2003 | Uemura et al. | JP | 09-235686 A | 9/1997 |
| 6,547,979 | B1 * | 4/2003 | Hineman et al. ............... 216/79 | JP | 09-251971 A | 9/1997 |
| 6,575,264 | B2 | 6/2003 | Spadafora | JP | 09-295900 A | 11/1997 |
| 6,592,664 | B1 | 7/2003 | Frey et al. | JP | 10-066948 A | 3/1998 |
| 6,610,611 | B2 | 8/2003 | Liu et al. | JP | 10-081588 A | 3/1998 |
| 6,712,298 | B2 | 3/2004 | Kohlberg et al. | JP | 10-081970 A | 3/1998 |
| 6,717,368 | B1 | 4/2004 | Skamoto et al. | JP | 10-087310 A | 4/1998 |
| 6,870,124 | B2 | 3/2005 | Kumar et al. | JP | 10-204641 A | 8/1998 |
| 2001/0027023 | A1 | 10/2001 | Ishihara et al. | JP | 10-259420 A | 9/1998 |
| 2001/0028919 | A1 | 10/2001 | Liu et al. | JP | 10-294306 A | 11/1998 |
| 2002/0034461 | A1 | 3/2002 | Segal | JP | 11-031599 A | 2/1999 |
| 2002/0036187 | A1 | 3/2002 | Ishll et al. | JP | 11-106947 A | 4/1999 |
| 2002/0124867 | A1 | 9/2002 | Kim et al. | JP | 11-145116 A | 5/1999 |
| 2002/0135308 | A1 | 9/2002 | Janos et al. | JP | 11-186222 A | 7/1999 |
| 2002/0140381 | A1 | 10/2002 | Golkowski et al. | JP | 11-228290 A | 8/1999 |
| 2002/0187614 | A1 * | 12/2002 | Downey ..................... 438/407 | JP | 11-265885 A | 9/1999 |
| 2002/0190061 | A1 | 12/2002 | Gerdes et al. | JP | 11-273895 A | 10/1999 |
| 2002/0197882 | A1 | 12/2002 | Niimi et al. | JP | 11-297266 A | 10/1999 |
| 2003/0003243 | A1 * | 1/2003 | Ueno ......................... 427/569 | JP | 2000-012526 A | 1/2000 |
| 2003/0071037 | A1 | 4/2003 | Sato et al. | JP | 2000-173989 A | 6/2000 |
| 2003/0111334 | A1 | 6/2003 | Dodelet et al. | JP | 2000-203990 A | 7/2000 |
| 2003/0111462 | A1 | 6/2003 | Sato et al. | JP | 2000-269182 A | 9/2000 |
| 2003/0166328 | A1 * | 9/2003 | Mizuno et al. ............... 438/513 | JP | 2000-288382 A | 10/2000 |
| 2004/0001295 | A1 | 1/2004 | Kumar et al. | JP | 2000-306901 A | 11/2000 |
| 2004/0004062 | A1 | 1/2004 | Kumar et al. | JP | 2000-310874 A | 11/2000 |
| 2004/0070347 | A1 | 4/2004 | Nishida et al. | JP | 2000-310876 A | 11/2000 |
| 2004/0089631 | A1 | 5/2004 | Blalock et al. | JP | 2000-317303 A | 11/2000 |
| 2004/0107796 | A1 | 6/2004 | Kumar et al. | JP | 2000-323463 A | 11/2000 |
| 2004/0107896 | A1 | 6/2004 | Kumar et al. | JP | 2000-348897 A | 12/2000 |
| 2004/0118816 | A1 | 6/2004 | Kumar et al. | JP | 2001-013719 A | 1/2001 |
| | | | | JP | 2001-053069 A | 2/2001 |
| | | FOREIGN PATENT DOCUMENTS | | JP | 2001-058127 A | 3/2001 |
| DE | | 195 42 352 A1 | 5/1997 | JP | 2001-093871 A | 4/2001 |
| DE | | 100 05 146 A1 | 8/2001 | JP | 2001-149754 A | 6/2001 |
| EP | | 0 228 864 B1 | 7/1987 | JP | 2001-149918 A | 6/2001 |
| EP | | 0 335 675 A2 | 10/1989 | JP | 2001-196420 A | 7/2001 |
| EP | | 0 435 591 A2 | 12/1990 | JP | 2001-303252 A | 10/2001 |
| EP | | 0 436 361 A1 | 12/1990 | JP | 2001-332532 A | 11/2001 |
| EP | | 0 228 864 B1 | 3/1991 | JP | 2001-351915 A | 12/2001 |
| EP | | 0 420 101 A2 | 4/1991 | JP | 2002-022135 A | 1/2002 |
| EP | | 0 435 591 A1 | 7/1991 | JP | 2002-028487 A | 1/2002 |
| EP | | 0 436 361 A1 | 7/1991 | JP | 2002-069643 A | 3/2002 |
| EP | | 0 520 719 B1 | 12/1992 | JP | 2002-075960 A | 3/2002 |
| EP | | 0 670 666 B1 | 9/1995 | JP | 2002-126502 A | 5/2002 |
| EP | | 0 520 719 B1 | 5/1996 | JP | 2002-273161 A | 9/2002 |
| EP | | 0 724 720 B1 | 8/1996 | JP | 2002-273168 A | 9/2002 |
| EP | | 0 670 666 B1 | 6/1998 | JP | 2003-075070 A | 3/2003 |
| EP | | 0 724 720 B1 | 5/2000 | JP | 2003-264057 A | 9/2003 |
| | | | | WO | 95-11442 A1 | 4/1995 |

| | | |
|---|---|---|
| WO | WO 95-11442 A1 | 4/1995 |
| WO | WO 96/06700 A1 | 3/1996 |
| WO | WO 96/38311 A1 | 12/1996 |
| WO | 97-13141 A1 | 4/1997 |
| WO | WO 97-13141 A1 | 4/1997 |
| WO | 01-55487 A2 | 8/2001 |
| WO | WO 01-55487 A2 | 8/2001 |
| WO | WO 01-58223 A1 | 8/2001 |
| WO | WO 01-82332 A1 | 11/2001 |
| WO | WO 02-26005 A1 | 3/2002 |
| WO | WO 02-061165 A1 | 8/2002 |
| WO | WO 02-061171 A1 | 8/2002 |
| WO | WO 02-062114 A1 | 8/2002 |
| WO | WO 02-062115 A1 | 8/2002 |
| WO | WO 02-067285 A2 | 8/2002 |
| WO | WO 02-067285 A3 | 8/2002 |
| WO | WO 03-018862 A2 | 3/2003 |
| WO | WO 03-018862 A3 | 3/2003 |
| WO | WO 03-028081 A2 | 4/2003 |
| WO | WO 03-095058 A2 | 11/2003 |
| WO | WO 03-095089 A1 | 11/2003 |
| WO | WO 03-095090 A1 | 11/2003 |
| WO | WO 03-095130 A1 | 11/2003 |
| WO | WO 03-095591 A1 | 11/2003 |
| WO | WO 03-095699 A1 | 11/2003 |
| WO | WO 03-095807 A1 | 11/2003 |
| WO | WO 03-096369 A1 | 11/2003 |
| WO | WO 03-096370 A1 | 11/2003 |
| WO | WO 03-096380 A2 | 11/2003 |
| WO | WO 03-096381 A2 | 11/2003 |
| WO | WO 03-096382 A2 | 11/2003 |
| WO | WO 03-096383 A2 | 11/2003 |
| WO | WO 03-096747 A2 | 11/2003 |
| WO | WO 03-096749 A1 | 11/2003 |
| WO | WO 03-096766 A1 | 11/2003 |
| WO | WO 03-096768 A1 | 11/2003 |
| WO | WO 03-096770 A1 | 11/2003 |
| WO | WO 03-096771 A1 | 11/2003 |
| WO | WO 03-096772 A1 | 11/2003 |
| WO | WO 03-096773 A1 | 11/2003 |
| WO | WO 03-096774 A1 | 11/2003 |
| WO | WO 04-050939 A2 | 6/2004 |
| WO | WO 2004-050939 A2 | 6/2004 |

OTHER PUBLICATIONS

Agrawal et al., "Grain Growth Control in Microwave Sintering of Ultrafine WC-Co Composite Powder Compacts," Euro PM99, Sintering, Italy, 8 pages (1999).
Agrawal et al., "Microwave Sintering of Commercial WC/Co Based Hard Metal Tools," Euro PM99, Sintering, Italy, 8 pages (1999).
Agrawal, D., "Metal Parts from Microwaves," 2 pages.
Agrawal, D., "Microwave Processing of Ceramics," *Current Opinion in Solid State and Material Science*, 3:480-485 (1998).
Air Liquide, Heat Treatment—Gas Quenching,—http://www.airliquide.com/en/business/industry/ metals/applications/heat_treatment/quenching , 1 page (2000).
Alexander et al., "Electrically Conducive Polymer Nanocomposite Materials," AFRL's Materials and Manufacturing Directorate, Non-metallic Materials Division, Polymer Branch, Wright-Patterson AFB OH—http://www.afrlhorizons.com/Briefs/Sept02/ML0206.html , 2 pages (Sep. 2002).
Al-Shamma'a et al., "Microwave Atmospheric Plasma for Cleaning Exhaust Gases and Particulates," University of Liverpool, Dept. of Electrical Engineering and Electronics.
Alton et al., "A High-Density, RF Plasma-Sputter Negative Ion Source," 3 pages.
Anklekar et al., Microwave Sintering And Mechanical Properties of PM Copper Steel, pp. 355-362 (2001).
Batanov et al., "Plasmachemical Deposition of Thin Films in a Localized Free-Space Microwave Discharge," *Technical Physics*, 38:6, pp. 475-479 (1993).

Carbonitriding, Treat All Metals, Inc., 2 pages—http://www.treatallmetals.com/carbon.htm.
Carburizing,—Heat Treating by Treat All Metals—http://www.treatallmetals.com/gas.htm, 2 pages.
Cheng et al., "Microwave Processing of WC-Co Composites And Ferroic Titanates" (Original Article), *Mat Res Innovat* (1):44-52 (1997).
Cheng, J., "Fabricating Transparent Ceramics by Microwave Sintering," *Focus on Electronics*, 79:9, pp. 71-74 (2000).
Circle Group Holdings, Inc. eMentor Companies "StarTech Environmental Corp."—http://www.crgq.com/cgiweb/HTML/eMentor_Companies/startech.html, 9 pages.
Classification of Cast Iron—Key to Steel—Article—http://www.key-to-steel.com/Articles/Art63.htm, 3 pages.
Collin, *Foundations for Microwave Engineering*, 2d Ed., IEEE Press, NY, pp. 180-192 (2001).
Controlled Atmosphere Sinter-Hardening, 2 pages.
Egashira,. "Decomposition of Trichloroethylene by Microwave-induced Plasma Generated from SiC whiskers," *J. Electrochem. Soc.*, 145:1, pp. 229-235 (Jan. 1998).
Ford 1.3L Catalytic Converter (1988-1989)—http://catalyticconverters.com/FO13L43778889.html, 1 page.
Ford Contour Catalytic Converter (1995-1996)—http://www.all-catalytic-converters.com/ford-contour-converter.html, 2 pages.
Fraunhofer ILT, "Plasma-Reactors for Aftertreatment of Automobile Exhaust Gas," Fraunhofer-Gesellschaft (2002)—http://www.ilt.fhg.de/eng/jb01-s35.html, 1 page.
French, "The Plasma Waste Converter—From Waste Disposal to Energy Creation,"—http://www.arofe.army.mil/Conferences/CWC2001/French.htm, p. 1.
Gao et al., "Superfast Densification of Oxide/Oxide Ceramic Composites," *J. Am. Ceram. Soc.* 82[4]1061-63 (1999)—http://216.239.39.100/search?q=cache:b-TFhQInU6YC:www.umr.edu/~hruiz/GaoShen.ppt+spark+plasma.
Gedevanishvili et al., "Microwave Combustion Synthesis And Sintering of Intermetallics And Alloys," *Journal of Materials Science Letters*, (18), pp 665-668 (1999).
General Eastern, Semiconductor Manufacturing—Using the HygroTwin 2850 to Reduce Costs, Improve Quality, TIM 003, 3 pages, (1997).
George, S.J., "The Catalytic Converter," 5 pages, (2002)—http://krioma.net/Articles/Catalytic%20Converter/Catalytic%20Converter.html.
GlassTesseract.Org—The Home of Kenz Benz, "Tech Procedures and Tips: Exhaust Manifolds and Catalytic Converters Removal—and Installation", 4 pages (2003)—http://glasstesseract.org/tech/catalytic.html.
Grant, J., Hackh's Chemical Dictionary, 3rd ed. p. 174-175.
Holt Walton & Hill, Heat Treatment of Steels—The Processes, Azom.com, 9 pages, (2002).
Holt Walton & Hill, Powder Metallurgy—Overview of the Powder Metallurgy Process, Azom.com, 3 pages (2002)—http://www.azom.com/details.asp?ArticleID=1414.
Honda Automobile News Press Release, "Honda Introduces Its First Two Clean Air Vehicles, the Civic Ferio LEV and Partners 1.6 LEV", 3 pages (Feb. 1997)—http://world.honda.com/news/1997/4970217a.html.
Honda Civic CX Catalytic Converter, 1 page (1996-2000)—http://www.catalyticconverters.com/HOCIVICCX4349600.html.
How A Blast Furnace Works—The Blast Furnace Plant, AISI Learning Center: http://www.steel.org/learning/howmade/blast_furnace.htm.
How Is Steel Made, Answer Discussion, 6 pages—http://ourworld.compuserve.com/homepages/Dyaros/stlmanuf.htm.
HSU et al., "Palladium-Coated Kieselguhr for Simultaneous Separation and Storage of Hydrogen," Westinghouse Savannah River Company, U.S. Dept. of Commerce, National Technical Information Service, 14 pages (2001).
Hydrogen Separation Membrane,—Advanced Gas Separation: H2 Separation, 1 page (2001).
IRC in Materials Processing, "Advanced Melting, Atomisation, Powder and Spray Forming, Plasma Melting—Operation of a Plasma Furnace,"University of Birmingham, 3 pages—http://www.irc.bham.ac.uk/theme1/plasma/furnace.htm.
*Iron and Steel*, 6:(16-22).
Japanese Advanced Environment Equipment, "Waste and Recycling Equipment—Mitsubishi Graphi Electrode Type Plasma Furnace," 3 pages—http://nett21.unep.or.jp/JSIM_DATA/WASTE/WASTE_3/html/Doc_467.html.
Johnson, D.L., "Fundamentals of Novel Materials Processing," Dept. of Materials Science & Engineering, Northwestern University, 2 pages—http://www.matsci.northwestern.edu/faculty/dlj.html.
Kalyanaraman et al., "Synthesis and Consolidation of Iron Nanopowders," *NanoStructured Materials*, vol. 10, No. 8, pp. 1379-1392 (1998).
Karger, Odo—Area of Work: Microwave Welding, 2 pages (Nov. 2002).
Kong et al., "Nuclear-Energy-Assisted Plasma Technology for Producing Hydrogen," Nuclear Energy Research Initiative, 4 pages (2002).
Lewis, R. J. Sr., "Hawley's Condensed Chemical Dictionary," 12th ed., p. 230-232 (1993).
Lucas, J., "Welding Using Microwave Power Supplies," Computer Electronics & Robotics—http://www.liv.ac.uk/EEE/research/cer/project6.htm.
Luggenholscher et al., "Investigations on Electric Field Distributions in a Microwave Discharge in Hydrogen," Institute fur Laser- und Plasmaphysik, Univsitat Essen, Germany, 4 pages.
Microelectronics Plasma Applications,—March Plasma Systems, 2 pages (2002)—http://www.marchplasma.com/micro_app.htm.
Micro-fabricated Palladium-Silver Membrane for Hydrogen Separation and Hydro/Dehydrogenation Reactions, Research Education Group, 5 pages—http://utep.el.utwente.nl/tt/projects/sepmem/.
Microwave Joining of Alumina and Zirconia Ceramics, IRIS, Research Topics 1998, 1 page.
Microwave Welding (EWi Welding Network) 1 page—http://www.ferris.edu/cot/accounts/plastics/ htdocs/Prey/Microwave%20Homepage.htm.
Microwave Welding of Plastics, TWI World Centre for Materials Joining Technology, 2 pages, (Aug. 2002)—http://www.twi.co.uk/j32k/protected/band_3/ksab001.htm.
Microwave Welding, Welding and Joining Information Network, 3 pages (Nov. 2002)—http://www.ewi.org/technologies/plastics/microwave.asp.
Moss et al., "Experimental Investigation of Hydrogen Transport Through Metals," Los Alamos National Library, 5 pages—http://www.education.lanl.gov/RESOURCES/h2/dye/education.html.
Nitriding, Treat All Metals, Inc., 2 pages -http://www.treatallmetals.com/nitrid.htm.
Non-Thermal Plasma Aftertreatment of Particulates—Theoretical Limits and Impact on Reactor Design, 27 pages—http://www.aeat.com/electrocat/sae/intro...references.htm.
Office of Energy Efficiency, "Using Non-Thermal Plasma Reactor to Reduce NOx Emissions from CIDI Engines," 1 page (Apr. 1999).
Optoelectronic Packaging Applications, March Plasma Systems, 2 pages (2002)—http://www.marchplasma.com/opto_app.htm.
Paglieri et al., "Palladium Alloy Composite Membranes for Hydrogen Separation," Abstract, Los Alamos National Library, 5 pages.
Peelamedu et al., "Anisothermal Reaction Synthesis of Garnets, Ferrites, And Spinels In Microwave Field," *Materials Research Bulletin* (36):2723-2739 (2001).
PerfectH2TM PE8000 Series, "Palladium Diffusion Hydrogen Purifier For High Flow Rate MOCVD Applications" Matheson Tri.Gas, 2 pages (2002).
Photonics Dictionary, "Definition for Word(s): Thyratron" (Laurin Publishing), 2 pages (1996-2003)—http://www.photonics.com/dictionary/lookup/lookup.asp?url=lookup&entrynum=538.
Pingel, V.J., "About What Every P/A Should Know About P/M," Powder Metallurgy Co., 9 pages—http://www.powdermetallurgyco.com/pm_about.htm.
Plasma Applications, Coalition for Plasma Science, 2 pages (1999, 2000)—http://www.plasmacoalition.org/applications.htm.
Plasma Carburizing, 1 page—http://www.ndkinc.co.jp/ndke04.html.

Plasma Direct Melting Furnace, Materials Magic, Hitachi Metals Ltd., 3 pages—http://www.hitachi-metals.co.jp/e/prod/prod07/p07_2_02.html.
Plasma Electronics, Classical Plasma Applications, 2 pages (2002)—http://www.plasma.iinpe.br/English/Classical_Applications.htm.
Plasma Nitride Process Description, Northeast Coating Technologies, 2 pages.
Plasma Science and Technology, "Plasmas for Home, Business and Transportation," p. 4—http://www.plasmas.org/rot-home.htm.
Plasma-Assisted Catalyst Systems, Novel Plasma Catalysts Significantly Reduce NOx from Diesel Engines, 2 pages (Apr. 2001)—http://www.ott.doe.gov/success.html (2 pages).
Printed Circuit Board (PCB) Plasma Applications, March Plasma Systems, 2 pages (2002)—http://www.marchplasma.com/pcb_app.01.htm.
Roy et al., "Full Sintering of Powdered-Metal Bodies In A Microwave Field," *Nature*, vol. 399, pp. 668-670 (Jun. 17, 1999).
Roy et al., "Microwave Processing: Triumph of Applications-Driven Science in WC-Composites And Ferroic Titanates," *Ceramic Transactions*, vol. 80, pp. 3-26, (1997).
Roy et al., "Definitive Experimental Evidence for Microwave Effects: Radically New Effects of Separated E and H Fields, Such As Decrystallization of Oxides in Seconds," *Materials Research Innovations*, Springer-Verlag, vol. 6, No. 3, pp. 129-140 (2002).
Roy et al., "Major phase transformations and magnetic property changescaused by electromagnetic fields at microwave frequencies," *Journal Of Material Research*, 17:12, pp. 3008-3011 (2002).
Rusanov, V.D., Hydrogen Energy & Plasma Technologies Institute: Russian Research Centre Kurchatov Institute, 13 pages,—http://www.kiae.ru/eng/str/ihept/oiivept.htm.
Samant et al., "Glow Discharge Nitriding A1 6063 Samples and Study of Their Surface Hardness," Metallofizika I Noveishe Takhnologii, 23(3), pp. 325-333 (2001).
Sato et al., Surface Modification of Pure Iron by RF Plasma Nitriding with DC Bias Voltage Impression, *Hyomen Gijutsu* 48(3), pp. 317-323 (1997) (English Abstract).
Saveliev Y. "Effect of Cathode End Caps and a Cathode Emissive Surface on Relativistic Magnetron Opeartion," *IEEE Transactions on Plasma Science*, 28:3, pp. 478-484 (Jun. 2000).
SC/Tetra Engine Manifold Application, 2 pages (2001)—http://www.sctetra.com/applications/01_manifold.htm.
Shulman et al., "Microwaves In High-Temperature Processes," GrafTech, 8 pages (Mar. 2003) http://www.industrialheating.com/CDA/ArticleInformation/features/BNP_Features_Item/0.2832,94035,00.html.
Slone et al., "Nox Reduction For Lean Exhaust Using Plasma Assisted Catalysis," Noxtech Inc., 5 pages (2000)—http://www.osti.gov/fcvt/deer2000/bhattpa.pdf.
Stockwell Rubber Company, Inc., "Conductive Silicone Rubber Compounds Product Selection Guide," Electrically Conducive Materials, 3 pages—http://www.stockwell.com/electrically_conducive_produc.htm.
Sumitomo Heavy Industries, Ltd., "Spark Plasma Sintering—What is Spark Plasma Sintering," 3 pages (2001)—http://www.shi.co.jp/sps/eng/.
Surface Hardening AHS Corp., 5 pages—http://www.ahscorp.com/surfaceh.html.
Takizawa et al. "Synthesis of inorganic materials by 28 GHz MW radiation," Proceed. Of The Symposium On Mw Effects And Applications, Aug. 2, 2001, Kokushikau Univ., Tokyo, Japan, pp. 52-53, (2001).
Taube et al. "Advances in Design of Microwave Resonance Plasma Source," American Institute of Chemical Engineering, 2004 Annual Meeting, Presentation (Nov. 2004).
testMAS: Pressure Sintering, 11 pages—http://cybercut.berkley.edu/mas2/processes/sinter_pressure.
The Amazing Metal Sponge: Simulations of Palladium-Hydride, Design of New Materials, 3 pages—http://www.psc.edu/science/Wolf/Wolf.html.
Toyota Motor Sales, "Emission Sub Systems—Catalytic Converter," 10 pages.

Uchikawa et al., "New Technique of Activating Palladium Surface for Absorption of Hydrogen or Deuterium," *Japanese Journal of Applied Physics*, vol. 32 (1993), pp. 5095-5096, Part 1, No. 11A (Nov. 1993).

Wang et al., "Densification of Al2O3 Powder Using Spark Plasma Sintering," *J. Mater. Res.*, 15:4. pp. 982-987 (Apr. 2000).

Way et al., "Palladium/Copper Allow Composite Membranes for High Temperature Hydrogen Separation from Coal-Derived Gas Streams," Dept. of Chemical Engineering, Colorado School of Mines, 3 pages (1999).

Welding Breakthrough: Generating and Handling a Microwave Powered Plasma, Australian Industry News, Information & Suppliers, 7 pages (Sep. 2001)—http://www.industry/search.com.au/features/microwave.asp.

Welding Plastic Parts, Business New Publishing Company, 4 pages (Nov. 2002)—http://www.assemblymag.com/Common/print_article.asp?rID=E455512C17534C31B96D.

Xie et al., "Effect of Rare Earth in Steel on Thermochemical Treatment," Xiuou Jinshu Cailiao Yu Gongcheng, 26(1), pp. 52-55 (Feb. 1997) (English Abstract).

Yahoo Canada—Autos, "Catalytic Converter Answer2," 4 pages (2001)—http://ca.autos.yahoo.com/maintain/catalytic_converteranswer2.html.

International Search Report issued on Jun. 26, 2003, in PCT/US03/14037.

International Search Report issued on Jul. 8, 2003, in PCT/US03/14124.

International Search Report issued on Jun. 24, 2003, in PCT/US03/14132.

International Search Report issued on Jul. 29, 2003, in PCT/US03/14052.

International Search Report issued on Jul. 29, 2003, in PCT/US03/14054.

International Search Report issued on Apr. 27, 2004, in PCT/US03/14036.

International Search Report issued on Aug. 21, 2003, in PCT/US03/14053.

International Search Report issued on Feb. 8, 2004, in PCT/US03/14034.

International Search Report issued on Aug. 29, 2003, in PCT/US03/14039.

International Search Report issued on Aug. 21, 2003, in PCT/US03/14038.

International Search Report issued on Aug. 24, 2003, in PCT/US03/14133.

International Search Report issued on Jul. 28, 2003, in PCT/US03/14035.

International Search Report issued on Jun. 27, 2003, in PCT/US03/14040.

International Search Report issued on Jul. 17, 2003, in PCT/US03/14134.

International Search Report issued on Jun. 27, 2003, in PCT/US03/14122.

International Search Report issued on Jun. 24, 2003, in PCT/US03/14130.

International Search Report issued on Apr. 30, 2004, in PCT/US03/14055.

International Search Report issued on Apr. 30, 2004, in PCT/US03/140137.

International Search Report issued on Aug. 21, 2003, in PCT/US03/14123.

International Search Report issued on Jul. 29, 2003, in PCT/US03/14121.

International Search Report issued on Aug. 24, 2003, in PCT/US03/14136.

International Search Report issued on May 3, 2004, in PCT/US03/14135.

Written Opinion issued on Apr. 13, 2004, in PCT/US03/014037.
Examination Report issued on Feb 24, 2004, in PCT/US03/14054.
Written Opinion issued on Dec. 22, 2003, in PCT/US03/14053.
Examination Report issued on Apr. 26, 2004, in PCT/US03/14053.
Written Opinion issued on Dec. 22, 2003, in PCT/US03/14123.
Examination Report issued on Apr. 26, 2004, in PCT/US03/14123.
Quayle Action issued on Apr. 19, 2005, in U.S. Appl. No. 10/449,600.
Quayle Action issued on Apr. 19, 2004, in U.S. Appl. No. 10/430,414.
Office Action issued on May 18, 2004, in U.S. Appl. No. 10/430,426.
Reply to Office Action filed on Nov. 18, 2004, in U.S. Appl. No. 10/430,426.
Office Action issued on Feb. 24, 2005, in U.S. Appl. No. 10/430,426.

Accentus Corporate Overview, 3 pages—http://www.accentus.co.uk/ipco/html/techenv6_txt_fr.html (2003).

Agrawal et al., "Grain Growth Control in Microwave Sintering of Ultrafine WC-Co Composite Powder Compacts," Euro PM99 Conference, Sintering, Turino, Italy, 8 pages (1999).

Agrawal, "Metals Parts from Microwaves," *Materials World* 7(11):672-673 (1999).

Agrawal et al., "Microwave Sintering of Commercial WC/Co Based Hard Metal Tools," Euro PM99 Conference, Sintering, Turino, Italy, 8 pages (1999).

Agrawal, "Microwave Processing of Ceramics," *Current Opinion in Solid State and Materials Science* 3:480-485 (Oct. 1998).

Air Liquide, "Heat Treatment—Gas Quenching,"—http://www.airliquide.com/en/business/industry/metals/applications/heat_treatment/quenching.asp, 1 page (2000).

Alexander et al., "Electrically Conductive Polymer Nanocomposite Materials," AFRL's Materials and Manufacturing Directorate, Nonmetallic Materials Division, Polymer Branch, Wright-Patterson AFB OH—http://www.afrlhorizons.com/Briefs/Sept02/ML0206,html , 2 pages (Sep. 2002).

Al-Shamma'a et al., "Microwave Atmospheric Plasma for Cleaning Exhaust Gases and Particulates," Future Car Congress, Washington, Jun. 3-5, 2002 (1 page).

Alton et al., "A High-Density, RF Plasma-Sputter Negative Ion Source," The 8th Intl. Conf. on Heavy-Ion Accelerator Technology, Argonne Natl. Lab., Oct. 5-9, 1998, Poster Presentation (3 pages).

Anklekar et al., "Microwave Sintering and Mechanical Properties of PM Copper Steel," *Powder Metallurgy* 44(4):355-362 (2001).

Batanov et al., "Plasmachemical Deposition of Thin Films in a Localized Free-Space Microwave Discharge," *Technical Physics* 38(6):475-479 (Jun. 1993).

"Carbonitriding," Treat All Metals, Inc., 2 pages—http://www.treatallmetals.com/carbon.htm.

"Carburizing," Treat All Metals, Inc.—http://www.treatallmetals.com/gas.htm, 2 pages.

Cheng, J., "Fabricating Transparent Ceramics by Microwave Sintering," *Am. Ceramic Soc. Bull.* 79(9):71-74 (2000).

Cheng et al., "Microwave Processing of WC-Co Composites And Ferroic Titanates" *Mat. Res. Innovat.* 1(1):44-52 (Jun. 1997).

Circle Group Holdings, Inc., "StarTech Environmental Corp."—http://www.crgq.com/cgiweb/HTML/eMentor_Companies/startech.html, 9 pages.

"Classification of Cast Iron"—Key to Steel—Article—http://www.key-to-steel.com/Articles/Art63.htm, 3 pages (1999).

Collin, in: *Foundations for Microwave Engineering*, 2d Ed., IEEE Press, NY, pp. 180-192 (2001).

"Controlled Atmospheres Sinter-Hardening,," Sarnes Ingenieure, 2 pages, http://www.space-ctrl.de/de/2002/06/399.php (2002).

Egashira et al., "Decomposition of Trichloroethylene by Microwave-Induced Plasma Generated from SiC Whiskers," *J. Electrochem. Soc.*, 145(1):229-235 (Jan. 1998).

Ford 1.3L Catalytic Converter (1988-1989) product description—http://catalyticconverters.com/FO13L43778889.html, 1 page, Undated.

Ford Contour Catalytic Converter (1995-1996) product description—http://www.all-catalytic-converters.com/ford-contour-converter.html, 2 pages, Undated.

Fraunhofer ILT, "Plasma-Reactors for Aftertreatment of Automobile Exhaust Gas," Fraunhofer-Gesellschaft—http://www.ilt.fhg.de/eng/jb01-s35.html, 1 page (2002).

French, "The Plasma Waste Converter—From Waste Disposal to Energy Creation," The International Chemical Weapons Demilitarization Conference, Gifu City, Japan (May 22-24, 2001)—http://www.arofe.army.mil/Conferences/CWC2001/French.htm, 1 page.

Gao et al., "Superfast Densification of Oxide/Oxide Ceramic Composites," *J. Am. Ceram. Soc.* 82(4)1061-1063 (1999).

Gedevanishvili et al., "Microwave Combustion Synthesis And Sintering of Intermetallics and Alloys," *J. Mat. Sci. Lett.* 18(9):665-668 (1999).

General Eastern, "Semiconductor Manufacturing—Using the HygroTwin 2850 to Reduce Costs, Improve Quality,", 3 pages, www.generaleastern.net (1997).

George, "The Catalytic Converter," 5 pages, (2002)—http://krioma.net/articles/Catalytic%20Converter/Catalytic%20Converter.htm.

GlassTesseract.Org website, "Tech Procedures and Tips: Exhaust Manifolds and Catalytic Converters Removal—and Installation", 4 pages (2003). http://glasstesseract.org/tech/catalytic.html.

*Hackh's Chemical Dictionary*, 3rd edition, J. Grant, Ed., McGraw Hill Book Co., NY, pp. 174-175 (1944).

"Heat Treatment of Steels—The Processes," AZoM.com, 9 pages, (2002)—www.azom.com.

"Powder Metallurgy—Overview of the Powder Metallurgy Process," AZoM.com, 3 pages (2002)—http://www.azom.com/details.asp?ArticleID=1414.

Honda Automobile News Press Release, "Honda Introduces Its First Two Clean Air Vehicles, the Civic Ferio LEV and Partner 1.6 LEV," 3 pages (Feb. 1997)—http://world.honda.com/news/1997/4970217a.html.

Honda Civic CX Catalytic Converter, (1996-2000) 1 page—http://www.catalyticconverters.com/HOCIVICCX4349600.html, Undated.

"How A Blast Furnace Works—The Blast Furnace Plant," AISI Learning Center, 7 pages. http://www.steel.org/learning/howmade/blast_furnace.htm., Undated.

"How Is Steel Made," Answer Discussion, 6 pages—http://ourworld.compuserve.com/homepages/Dyaros/stlmanuf.htm, Undated.

Hsu et al., "Palladium-Coated Kieselguhr for Stimultaneous Separation and Storage of Hydrogen," Westinghouse Savannah River Company, U.S. Dept. of Commerce, National Technical Information Service, 14 pages (2001).

Fincke, "Hydrogen Separation Membrane,—Advanced Gas Separation: H2 Separation," Summary of research proposal, 1 page (2003).

"IRC in Materials Processing: Advanced Melting, Atomisation, Powder and Spray Forming, Plasma Melting—Operation of a Plasma Furnace," University of Birmingham website, 3 pages—http://www.irc.bham.ac.uk/theme1/plasma/furnace.htm, Undated.

Savilee, in: *Iron and Steel*, Chapter 6, pp. 16-22, Wayland Publ., England (1976).

Japanese Advanced Environment Equipment, "Mitsubishi Graphite Electrode Type Plasma Furnace," 3 pages, Undated—http://nett21.unep.or.jp/JSIM_DATA/WASTE/WASTE_3/html/Doc_467.html.

Johnson, Faculty Biography webpage, Dept. of Materials Science & Engineering, Northwestern University, 2 pages—http://www.matsci.northwestern.edu/faculty/ dlj.html, Undated.

Kalyanaraman et al., "Synthesis and Consolidation of Iron Nanopowders," *NanoStructured Materials* 10(8):1379-1392 (1998).

Karger, Scientific Staff Research Areas for KTP Company, 2 pages (Nov. 2002)—http://wwwfb10.upb.de/KTP/KTP-ENG/Staff/Karger/body_karger.html.

Kong et al., "Nuclear-Energy-Assisted Plasma Technology for Producing Hydrogen," Nuclear Energy Research Initiative Research Proposal, 4 pages (2002).

Lewis, in: *Hawley's Condensed Chemical Dictionary*, 12th ed., pp. 230-232, Van Nostrand Reinhold, NY (1993).

Lucas, "Welding Using Microwave Power Supplies," Faculty webpage, 1 page—http://www.liv.ac.uk/EEE/research/cer/project6.htm, Undated.

Luggenholscher et al., "Investigations on Electric Field Distributions in a Microwave Discharge in Hydrogen," Institute fur Laser- und Plasmaphysik, Univsitat Essen, Germany, 4 pages, Undated.

March Plasma Systems, product descriptions,2 pages (2002)—http://www.marchplasma.com/micro_app.htm, Undated.

"Micro-fabricated Palladium-Silver Membrane for Hydrogen Separation and Hydro/Dehydrogenation Reactions," Research Education Group webpage, 5 pages—http://utep.el.utwente.nl/tt/projects/sepmem/—Undated.

Ahmed et al., "Microwave Joining of Alumina and Zirconia Ceramics," IRIS Research Topics 1998, 1 page (1988).

"Microwave Welding," EWi WeldNet, 1 page—(2003) http://www.ferris.edu/cot/accounts/plastics/ htdocs/Prey/Microwave%20Homepage.htm.

"Microwave Welding of Plastics," TWI World Centre for Materials Joining Technology, 2 pages, (Aug. 2002)—http://www.twi.co.uk/j32k/protected/band_3/ksab001.htm.

"Microwave Welding," Welding and Joining Information Network, 3 pages (Nov. 2002)—http://www.ewi.org/technologies/plastics/microwave.asp.

Moss et al., "Experimental Investigation of Hydrogen Transport Through Metals," Experiment Description, Los Alamos National Library, 5 pages—Undated. http://www.education.lanl.gov/RESOURCES/h2/dye/education.html.

"Nitriding," Treat All Metals, Inc., 2 pages—Undated—http://www.treatallmetals.com/nitrid.htm.

Thomas et al., "Non-Thermal Plasma Aftertreatment of Particulates—Theoretical Limits and Impact on Reactor Design," SAE Spring Fuels and Lubes Conference, Paris, France, 27 pages—Jun. 19-22, 2000—http://www.aeat.co.uk/electrocat/sae/saepaper.htm.

"Using Non-Thermal Plasma Reactor to Reduce NOx Emissions from CIDI Engines," Office of Energy Efficiency and Renewable Energy, Office of Transportation, 1 page (Apr. 1999).

"Optoelectronic Packaging Applications," March Plasma Systems, Product Description, 2 pages (2002)—http://www.marchplasma.com/opto_app.htm.

Paglieri et al., "Palladium Alloy Composite Membranes for Hydrogen Separation," 15th Annual Conf. Fossil Energy Matter, Knoxville, TN (2001), 5 pages.

Peelamedu et al., "Anisothermal Reaction Synthesis of Garnets, Ferrites, and Spinels In Microwave Field," *Materials Research Bulletin* 36:2723-2739 (Dec. 2001).

PerfectH2 PE8000 Series Product Description, Palladium Diffusion Hydrogen Purifier For High Flow Rate MOCVD Applications, Matheson Tri.Gas, 2 pages (2002).

Photonics Directory, Definition for Thyratron, (Laurin Publishing), 2 pages http://www.photonics.com/dictionary/.

Pingel, "About What Every P/A Should Know About P/M," Powder Metallurgy Co., 9 pages—http://www.powdermetallurgyco.com/pm_about.htm.

"Plasma Applications," Coalition for Plasma Science, 2 pages (1999, 2000)—http://www.plasmacoalition.org/applications.htm.

"Plasma Carburizing," 1 page—Undated, http://www.ndkinc.co.jp/ndke04.html.

"Plasma Direct Melting Furnace," Materials Magic, Hitachi Metals Ltd., 3 pages—Undated, http://www.hitachi-metals.co.jp/e/prod/prod07/p07_2_02.html.

"Classical Plasma Applications," 2 pages (2002)—http://www.plasma.iinpe.br/English/Classical_Applications.htm.

"Plasma Nitride Process Description," Northeast Coating Technologies, 2 pages, Undated, www.northeastcoating.com.

Plasma Science and Technology, "Plasmas for Home, Business and Transportation," 4 pages—Undated. http://www.plasmas.org/rot-home.htm.

"Novel Plasma Catalysts Significantly Reduce NOx from Diesel Engines," US Department of Energy research summary, 2 pages (Apr. 2001)—http://www.ott.doe.gov/success.html.

"Printed Circuit Board (PCB) Plasma Applications," March Plasma Systems product descriptions, 2 pages (2002)—http://www.marchplasma.com/pcb_app.01.htm.

Roy et al., "Definitive Experimental Evidence for Microwave Effects: Radically New Effects of Separated E and H Fields, Such As Decrystallization of Oxides in Seconds," *Materials Research Innovations* 6(3):129-140 (2002).

Roy et al., "Full Sintering of Powdered-Metal Bodies In A Microwave Field," *Nature* 399:668-670 (Jun. 17, 1999).

Roy et al., "Major phase transformations and magnetic property changes caused by electromagnetic fields at microwave frequencies," *J. Mat. Res.* 17(2):3008-3011 (2002).

Roy et al., "Microwave Processing: Triumph of Applications-Driven Science in WC-Composites And Ferroic Titanates," *Ceramic Transactions* 80:3-26, (1997).

Rusanov, Introduction to the Hydrogen Energy & Plasma Technologies Institute: Russian Research Centre Kurchatov Institute, 13 pages, Undated—http://www.kiae.ru/eng/str/ihept/oiivept.htm.

Samant et al., "Glow Discharge Plasma Nitriding of Al 6063 Samples and Study of Their Surface Hardness," *Metallofiz. Noveishe Tekhnol.* 23(3):325-333 (2001).

Sato et al., "Surface Modification of Pure Iron by rf Plasma Nitriding with dc Bias Voltage Impression," *Hyomen Gijutsu* 48(3):317-323 (1997) (English Abstract).

Saveliev et al., "Effect of Cathode End Caps and a Cathode Emissive Surface on Relativistic Magnetron Operation," *IEEE Transactions on Plasma Science* 28:3.478-484 (Jun. 2000).

SC/Tetra Engine Manifold Application, 2 pages (2001)—http://www.sctetra.com/applications/01_manifold.htm.

Shulman, "Microwaves In High-Temperature Processes," GrafTech Intl. Ltd., 8 pages (Mar. 2003) http://www.industrialheating.com/CDA/ArticleInformation/features/BNP_Features_Item/0,2832,94035,00.html.

Slone et al., "NOx Reduction For Lean Exhaust Using Plasma Assisted Catalysis," NOXTECH Inc., 5 pages (2000)—http://www.osti.gov/fcvt/deer2000/bhattpa.pdf.

Stockwell Rubber Company, Inc., "Conductive Silicone Rubber Compounds Product Selection Guide," Electrically Conducive Materials Chart, 3 pages, Undated—http://www.stockwell.com/electrically_conducive_produc.htm.

Sumitomo Heavy Industries, Ltd., "Spark Plasma Sintering," 3 pages (2001)—http://www.shi.co.jp/sps/eng/.

"Surface Hardening" Services Description for AHS Corp., 5 pages, Undated—http://www.ahscorp.com/surfaceh.html.

Takizawa et al. "Synthesis of inorganic materials by 28 GHz Microwave Irradiation," *Transactions of the Materials Research Society of Japan* 27(1):51-54 (2002).

Taube et al., "Advances in Design of Microwave Resonance Plasma Source," American Institute of Chemical Engineering, 2004 Annual Meeting, Presentation (Nov. 2004).

"testMAS: Pressure Sintering," 11 pages, Undated—http://cybercut.berkley.edu/mas2/processes/sinter_pressure.

Wolf et al., "The Amazing Metal Sponge: Simulations of Palladium-Hydride," 2 pages, Undated—http://www.psc.edu/science/Wolf/Wolf.html.

Toyota Motor Sales, "Emission Sub Systems—Catalytic Converter," 10 pages, Undated.

Uchikawa et al., "New Technique of Activating Palladium Surface for Absorption of Hydrogen or Deuterium," *Japanese J. Appl. Phys.* 32:5095-5096, Part 1, No. 11A (Nov. 1993).

Wang et al., "Densification of $Al_2O_3$ Powder Using Spark Plasma Sintering," *J. Mater. Res.*, 15(4):982-987 (Apr. 2000).

Way et al., "Palladium/Copper Alloy Composite Membranes for High Temperature Hydrogen Separation from Coal-Derived Gas Streams," Research Grant Report, Dept. of Chemical Engineering, Colorado School of Mines, 3 pages (1999).

Lucas, "Welding Breakthrough: Generating and Handling a Microwave Powered Plasma," Australian Industry News, Information & Suppliers, 7 pages (Sep. 2001)—http://www.industry/search.com.au/features/microwave.asp.

"Welding Plastic Parts," Business New Publishing Company, 4 pages (Nov. 2000)—http://www.assemblymag.com/Common/print_article.asp?rID=E455512C17534C31B96D.

Xie et al., "Effect of Rare Earths in Steels on the Thermochemical Treatments and the Functional Mechanisms of the Rare Earths," *Rare Metals Materials and Engineering* 26(1): 52-55 (Feb. 1997) (English Abstract).

Yahoo Canada—Autos, "Catalytic Converter Answer2," 4 pages (2001)—http://ca.autos.yahoo.com/maintain/catalytic_converteranswer2.html.

International Search Report issued on Jul. 23, 2003, in PCT/US03/14037.

International Search Report issued on Aug. 25, 2003, in PCT/US03/14124.

International Search Report issued on Sep. 10, 2003, in PCT/US03/14132.

International Search Report issued on Aug. 14, 2003, in PCT/US03/14052.

International Search Report issued on Aug. 14, 2003, in PCT/US03/14054.

International Search Report issued on May 10, 2004, in PCT/US03/14036.

International Search Report issued on Aug. 9, 2003, in PCT/US03/14053.

International Search Report issued on Feb. 25, 2004, in PCT/US03/14034.

International Search Report issued on Sep. 19, 2003, in PCT/US03/14039.

International Search Report issued on Aug. 29, 2003, in PCT/US03/14038.

International Search Report issued on Dec. 30, 2003, in PCT/US03/14133.

International Search Report issued on Aug. 28, 2003, in PCT/US03/14035.

International Search Report issued on Jul. 29, 2003, in PCT/US03/14040.

International Search Report issued on Sep. 10, 2003, in PCT/US03/14134.

International Search Report issued on Aug. 29, 2003, in PCT/US03/14122.

International Search Report issued on Sep. 30, 2003, in PCT/US03/14130.

International Search Report issued on May 24, 2004, in PCT/US03/14055.

International Search Report issued on May 26, 2004, in PCT/US03/14137.

International Search Report issued on Aug. 29, 2003, in PCT/US03/14123.

International Search Report issued on Aug. 29, 2003, in PCT/US03/14121.

International Search Report issued on Sep. 16, 2003, in PCT/US03/14136.

International Search Report issued on May 25, 2004, in PCT/US03/14135.

Examination Report issued on Feb. 24, 2004, in PCT/US03/14054.

Examination Report issued on Apr. 26, 2004, in PCT/US03/1423.

Quayle Action issued Apr. 19, 2004, in U.S. Appl. No. 10/430,414.

Reply to Office Action filed on Nov. 18, 2004, in U.S. Appl. No. 10/430,426.

Office Action issued on Feb. 24, 2004, in U.S. Appl. No. 10/430,426.

Willert-Porada, M., "Alternative Sintering Methods" 1 page Abstract dated Nov. 8, 2001, http://www.itap.physik.uni-stuttgart.de/~gkig/neu/english/welcome.php?/~gkig/neu/abstracts/abstract_willert-porada.html.

\* cited by examiner

PLASMA-ASSISTED DOPING

CROSS-REFERENCE OF RELATED APPLICATIONS

Priority is claimed to U.S. Provisional Patent Application No. 60/378,693, filed May 8, 2002, No. 60/430,677, filed Dec. 4, 2002, and No. 60/435,278, filed Dec. 23, 2002, all of which are fully incorporated herein by reference.

FIELD OF THE INVENTION

This invention relates to methods and apparatus for plasma-assisted doping, and particularly for doping one or more substrates using an electromagnetic radiation induced plasma with a plasma catalyst.

BACKGROUND

Conventional doping processes normally involve introduction of an impurity material (e.g., a dopant) onto the surface of a semiconductor substrate. This dopant material is usually deposited onto, or implanted into, the surface of the substrate, and then diffused into the substrate to a predetermined depth by a process commonly called "drive-in diffusion." Depending on the type of dopant material used, the doped substrate can be made n-type (using donors) or p-type (using acceptors).

In some instances, implantation of dopant species, such as by ion beam implantation, may undesirably damage the crystal structure in the surface region of a semiconductor substrate. It may be desirable to instead deposit a thin (~angstroms) layer of dopant material on the surface of the substrate, and then apply heat to the substrate to diffuse the dopant material. This heating process can require heating the entire substrate in a furnace at high temperatures for fixed time periods. As semiconductor device dimensions become smaller, however, more flexible alternatives are needed that will achieve desired doping of substrates without the potential for damage either by implantation or high temperature bulk heating and diffusion treatments.

BRIEF SUMMARY OF A FEW ASPECTS OF THE INVENTION

Methods and apparatus for plasma-assisted doping are provided. In one embodiment, a catalyzed doping plasma can be formed in a cavity by subjecting a gas to an amount of electromagnetic radiation in the presence of a plasma catalyst, adding at least one dopant to the plasma, and allowing the at least one dopant to penetrate below the surface of a substrate over a penetration time period.

In one embodiment consistent with this invention, the doping method can include flowing a gas containing dopant material into a processing cavity (e.g., a multi-mode cavity) and igniting a plasma by subjecting the gas in the cavity to electromagnetic radiation having a frequency less than about 333 GHz in the presence of at least one passive plasma catalyst that includes a material that is at least electrically semi-conductive.

In another embodiment, a plasma-assisted doping system for doping substrates is provided. The system can include a vessel in which a cavity is formed, an electromagnetic radiation source coupled to the cavity such that the electromagnetic radiation source can direct electromagnetic radiation into the cavity during the doping process, a gas source coupled to the cavity so that a gas conveying dopant material can flow into the cavity during the doping process, and at least one plasma catalyst located in the presence of the radiation (e.g., located in or near the cavity).

Plasma catalysts for initiating, modulating, and sustaining a plasma are also provided. A plasma catalyst may be passive or active. A passive plasma catalyst can include any object capable of inducing a plasma by deforming a local electric field (e.g., an electromagnetic field) consistent with this invention, without necessarily adding additional energy. An active plasma catalyst can be any particle or high energy wave packet capable of transferring a sufficient amount of energy to a gaseous atom or molecule to remove at least one electron from the gaseous atom or molecule in the presence of electromagnetic radiation. In both the passive and active cases, a plasma catalyst can improve, or relax, the environmental conditions required to ignite a plasma for performing various types of doping processes.

Additional plasma catalysts, and methods and apparatus for igniting, modulating, and sustaining a plasma for the purpose of doping a substrate are also provided.

BRIEF DESCRIPTION OF THE DRAWINGS

Further aspects of the invention will be apparent upon consideration of the following detailed description, taken in conjunction with the accompanying drawings, in which like reference characters refer to like parts throughout, and in which.

DETAILED DESCRIPTION OF THE EMBODIMENTS

This invention can relate to methods and apparatus for initiating, modulating, and sustaining a plasma for a variety of doping applications, including, for example, doping semiconductors and other materials. Thus, this invention can be used for controllable plasma-assisted doping that may lower energy costs and increase doping versatility and manufacturing flexibility.

One doping method consistent with this invention can include adding a gas, a plasma catalyst, and electromagnetic radiation to a cavity for catalyzing a doping plasma. As used herein, any plasma formed with a plasma catalyst for the purpose of doping one or more objects is a "catalyzed doping plasma," or more simply, "doping plasma."

The catalyst can be passive or active. A passive plasma catalyst can include any object capable of inducing a plasma by deforming a local electric field (e.g., an electromagnetic field) consistent with this invention without necessarily adding additional energy through the catalyst, such as by applying a voltage to create a spark. An active plasma catalyst, on the other hand, may be any particle or high energy wave packet capable of transferring a sufficient amount of energy to a gaseous atom or molecule to remove at least one electron from the gaseous atom or molecule, in the presence of electromagnetic radiation.

The following commonly owned, concurrently filed U.S. patent applications are hereby incorporated by reference in their entireties: U.S. patent application Ser. No. 10/513,229, U.S. patent application Ser. No. 10/513,313, PCT Application US03/14132, now expired, U.S. patent application Ser. No. 10/513,394, U.S. patent application Ser. No. 10/513,607, U.S. patent application Ser. No. 10/449,600, PCT Application US03/14034, now expired, U.S. patent application Ser. No. 10/430,416, U.S. patent application Ser. No. 10/430,415, PCT Application US03/14133, now expired, U.S. patent application Ser. No. 10/513,606, U.S. patent application Ser. No. 10/513,309, U.S. patent application Ser. No. 10/513,220, PCT Application US03/14122, now expired, U.S. patent application Ser. No. 10/513,397, U.S. patent application Ser. No. 10/513,605, PCT Application US03/14137, now expired, U.S. patent application Ser. No. 10/430,426, PCT Application US03/14121, now expired, U.S. patent application Ser. No. 10/513,604, and PCT Application US3/14135.

Illustrative Plasma System

Figure 1:
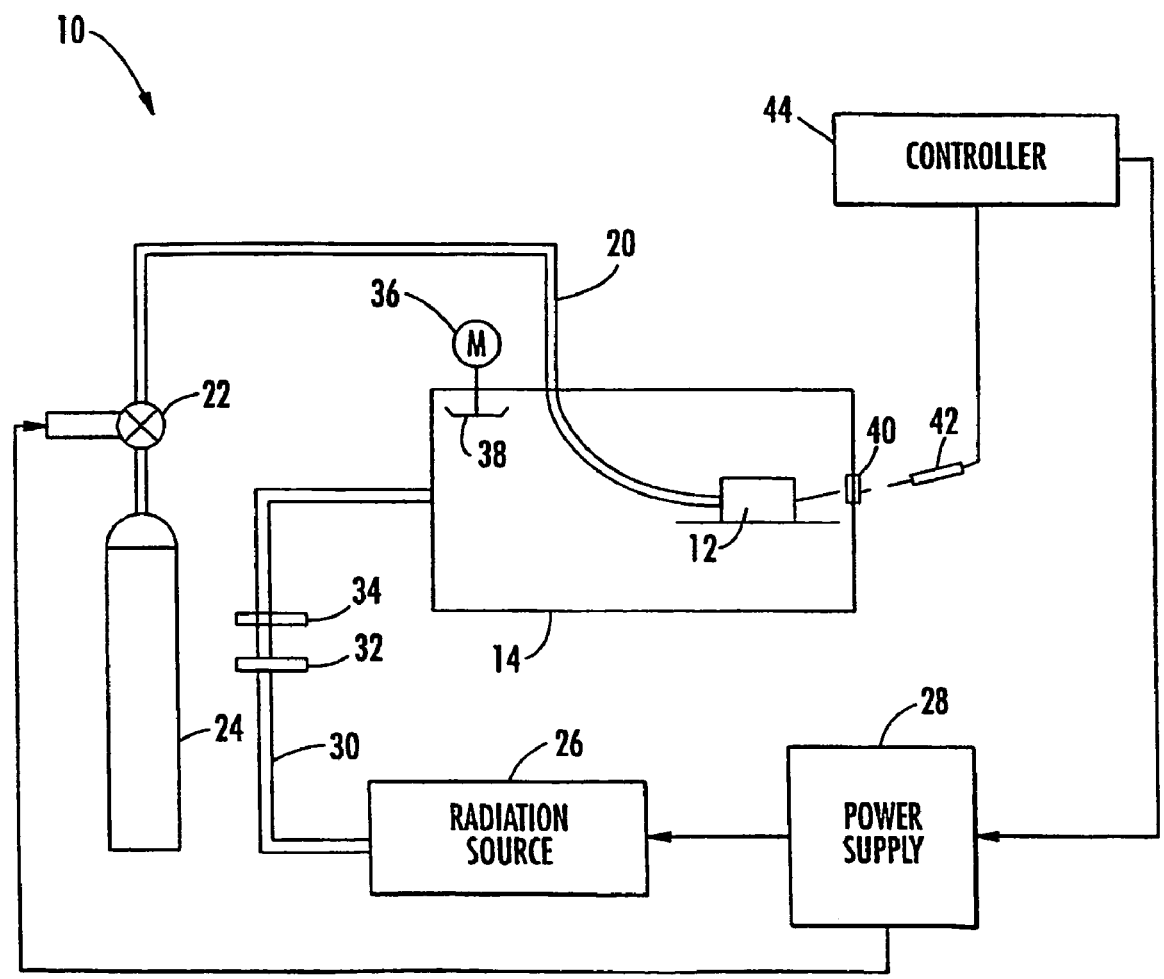
FIG. 1 shows a schematic diagram of an illustrative plasma-assisted doping system consistent with this invention.

FIG. 1 shows illustrative plasma-assisted doping system 10 consistent with one aspect of this invention. In this embodiment, cavity 12 can be formed in a vessel positioned inside electromagnetic radiation chamber (i.e., applicator) 14. In another embodiment (not shown), vessel 12 and electromagnetic radiation chamber 14 are the same, thereby eliminating the need for two separate components. The vessel in which cavity 12 is formed can include one or more electromagnetic radiation-transmissive insulating layers to improve its thermal insulation properties without significantly shielding cavity 12 from the electromagnetic radiation.

In one embodiment, cavity 12 is formed in a vessel made of ceramic. Due to the extremely high temperatures that can be achieved with plasmas consistent with this invention, the upper temperature limit for processing is restricted only by the melting point of the material (e.g., ceramic) used to make the vessel. In one experiment, for example, a ceramic capable of withstanding about 3,000 degrees Fahrenheit was used. For example, the ceramic material can include, by weight, 29.8% silica, 68.2% alumina, 0.4% ferric oxide, 1% titania, 0.1% lime, 0.1% magnesia, 0.4% alkalis, which is sold under Model No. LW-30 by New Castle Refractories Company, of New Castle, Pa. It will be appreciated by those of ordinary skill in the art, however, that other materials, such as quartz, and those different (e.g., those having higher or lower melting temperatures) from the ceramic material described above, can also be used consistent with the invention.

In one successful experiment, a plasma was formed in a partially open cavity inside a first brick and topped with a second brick. The cavity had dimensions of about 2 inches by about 2 inches by about 1.5 inches. At least two holes were also provided in the brick in communication with the cavity: one for viewing the plasma and at least one hole for providing the gas. The size of the cavity can depend on the desired plasma process being performed. Also, the cavity should at least be configured to prevent the plasma from rising/floating away from the primary processing region, even though the plasma may not contact the substrate.

Cavity 12 can be connected to one or more gas sources 24 (e.g., a source of argon, nitrogen, hydrogen, xenon, krypton, etc.) by line 20 and control valve 22, which may be powered by power supply 28. Line 20 may be tubing (e.g., between about 1/16 inch and about 1/4 inch, such as about 1/8"), but could be any device capable of supplying gas. Also, if desired, a vacuum pump can be connected to the chamber to remove any undesirable contaminants that may be generated during plasma processing.

A radiation leak detector (not shown) was installed near source 26 and waveguide 30 and connected to a safety interlock system to automatically turn off the electromagnetic radiation power supply if a leak above a predefined safety limit, such as one specified by the FCC and/or OSHA (e.g., 5 mW/cm$^2$), was detected.

Electromagnetic radiation source 26, which can be powered by electrical power supply 28, directs electromagnetic radiation into chamber 14 through one or more waveguides 30. It will be appreciated by those of ordinary skill in the art that electromagnetic source 26 can be connected directly to chamber 14 or cavity 12, thereby eliminating waveguide 30. The electromagnetic radiation entering chamber 14 or cavity 12 is used to ignite a plasma within the cavity. This catalyzed plasma can be substantially modulated or sustained and confined to the cavity by coupling additional electromagnetic radiation with the catalyst.

Electromagnetic radiation can be supplied through circulator 32 and tuner 34 (e.g., 3-stub tuner). Tuner 34 can be used to minimize the reflected power as a function of changing ignition or processing conditions, especially after the catalyzed plasma has formed because electromagnetic radiation will be strongly absorbed by the plasma.

As explained more fully below, the location of electromagnetic radiation-transmissive cavity 12 in chamber 14 may not be critical if chamber 14 supports multiple modes, and especially when the modes are continually or periodically mixed.

As also explained more fully below, motor 36 can be connected to mode-mixer 38 for making the time-averaged electromagnetic radiation energy distribution substantially uniform throughout chamber 14. Furthermore, window 40 (e.g., a quartz window) can be disposed in one wall of chamber 14 adjacent to cavity 12, permitting temperature sensor 42 (e.g., an optical pyrometer) to be used to view a process inside cavity 12. In one embodiment, the optical pyrometer output can increase from zero volts as the temperature rises to within the tracking range. The pyrometer can be used to sense radiant intensities at two or more wavelengths and to fit those intensities using Planck's law to determine the temperature of the work piece. The pyrometer can also establish the temperature of a species present in the plasma by monitoring its excited state population distribution from the emission intensities at two discrete transitions.

Sensor 42 can develop output signals as a function of the temperature or any other monitorable condition associated with a work piece (not shown) within cavity 12 and provide the signals to controller 44. Dual temperature sensing and heating, as well as automated cooling rate and gas flow controls can also be used. Controller 44 in turn can be used to control operation of power supply 28, which can have one output connected to electromagnetic radiation source 26 as described above, and another output connected to valve 22 to control gas flow into cavity 12.

The invention may be practiced employing electromagnetic radiation sources at, for example, both 915 MHz and 2.45 GHz, provided by Communications and Power Industries (CPI), although radiation having any frequency less than about 333 GHz can be used. The 2.45 GHz system provided continuously variable electromagnetic radiation power from about 0.5 kilowatts to about 5.0 kilowatts. Consistent with one embodiment of the present invention, the electromagnetic radiation power density during doping may be between about 0.05 W/cm$^3$ and about 100 W/cm$^3$, for example, at about 2.5 W/cm$^3$. A 3-stub tuner allowed impedance matching for maximum power transfer and a dual directional coupler was used to measure forward and reflected powers. Also, optical pyrometers were used for remote sensing of the substrate temperature.

As mentioned above, radiation having any frequency less than-about 333 GHz can be used consistent with this invention. For example, frequencies, such as power line frequencies (about 50 Hz to about 60 Hz), can be used, although the pressure of the gas from which the plasma is formed may be lowered to assist with plasma ignition. Also, any radio frequency or microwave frequency can be used consistent with this invention, including frequencies greater than about 100 kHz. In most cases, the gas pressure for such relatively high frequencies need not be lowered to ignite, modulate, or sustain a plasma, thereby enabling many plasma-processes to occur at atmospheric pressures and above.

The equipment was computer controlled using LabVIEW® 6i software, which provided real-time temperature monitoring and electromagnetic radiation power control. LabVIEW® graphical development environment was used to automate data acquisition, instrument control, measurement analysis, and data presentation. LabVIEW® is available from the National Instruments Corporation, of Austin, Tex.

Noise was reduced by using sliding averages of suitable number of data points. Also, to improve speed and computational efficiency, the number of stored data points in the buffer array were limited by using shift registers and buffer sizing. The pyrometer measured the temperature of a sensitive area of about 1 cm$^2$, which was used to calculate an average temperature. The pyrometer sensed radiant intensities at two wavelengths and fit those intensities using Planck's law to determine the temperature. It will be appreciated, however, that other devices and methods for monitoring and controlling temperature are also available and can be used consistent with this invention. Control software that can be used consistent with this invention is described, for example, in commonly owned, concurrently filed PCT Application US03/14135, now expired, which is hereby incorporated by reference in its entirety.

Chamber 14 had several glass-covered viewing ports with electromagnetic radiation shields and one quartz window for pyrometer access. Several ports for connection to a vacuum pump and a gas source were also provided, although not necessarily used.

System 10 also included a closed-loop de-ionized water cooling system (not shown) with an external heat exchanger cooled by tap water. During operation, the de-ionized water first cooled the magnetron, then the load-dump in the circulator (used to protect the magnetron), and finally the electromagnetic radiation chamber through water channels welded on the outer surface of the chamber.

Plasma Catalysts

As mentioned previously, a plasma catalyst consistent with this invention can include one or more different materials and may be either passive or active. A plasma catalyst can be used, among other things, to ignite, modulate, and/or sustain a doping plasma at a gas pressure that is less than, equal to, or greater than atmospheric pressure. It can also be used to introduce cavity materials into a plasma.

One method of forming a plasma consistent with this invention can include subjecting a gas in a cavity to electromagnetic radiation having a frequency less than about 333 GHz in the presence of a passive plasma catalyst. A passive plasma catalyst consistent with this invention can include any object capable of inducing a plasma by deforming a local electric field (e.g., an electromagnetic field) consistent with this invention, without necessarily adding additional energy through the catalyst, such as by applying an electric voltage to create a spark.

A passive plasma catalyst consistent with this invention can also be a nano-particle or a nano-tube. As used herein, the term "nano-particle" can include any particle having a maximum physical dimension less than about 100 nm that is at least electrically semi-conductive. Also, both single-walled and multi-walled carbon nanotubes, doped and undoped, can be particularly effective for igniting plasmas consistent with this invention because of their exceptional electrical conductivity and elongated shape. The nanotubes can have any convenient length and can be a powder fixed to a substrate. If fixed, the nanotubes can be oriented randomly on the surface of the substrate or fixed to the substrate (e.g., at some predetermined orientation) while the plasma is ignited or sustained.

A passive plasma catalyst can also be a powder consistent with this invention, and need not be made of nano-particles or nano-tubes. It can be formed, for example, from fibers, dust particles, flakes, sheets, etc. When in powder form, the catalyst can be suspended, at least temporarily, in a gas. By suspending the powder in the gas, the powder can be quickly dispersed throughout the cavity and more easily consumed, if desired.

Figure 1A:
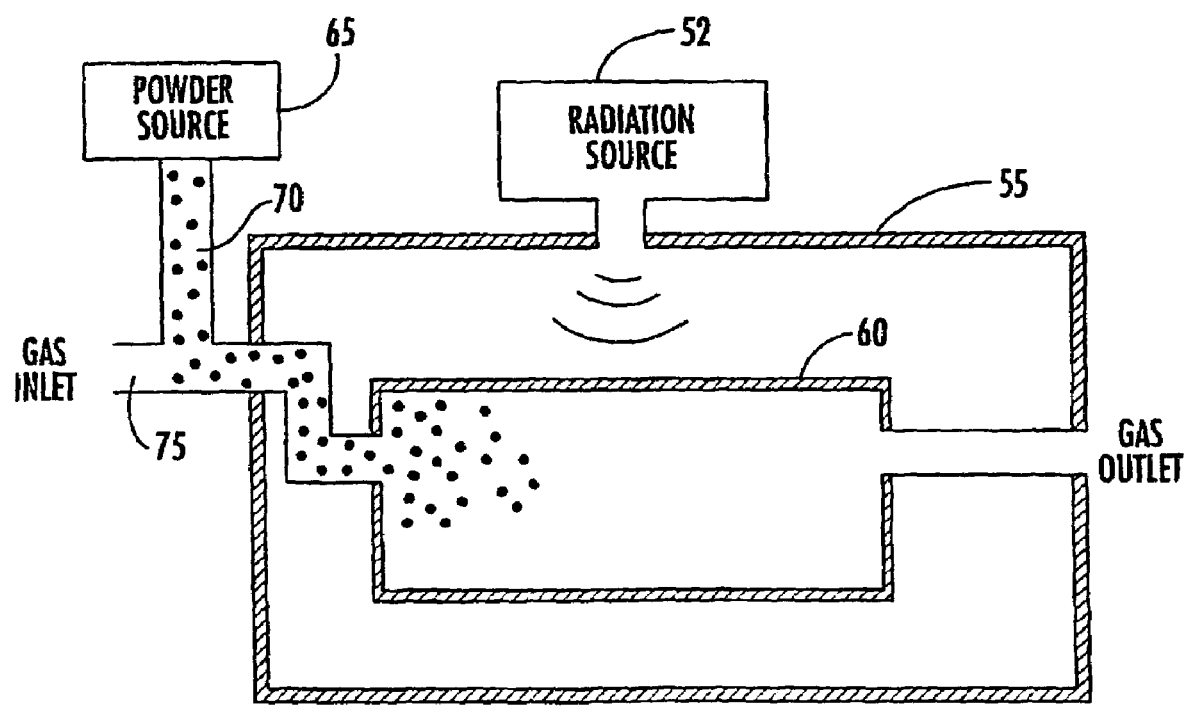
FIG. 1A shows an illustrative embodiment of a portion of a plasma-assisted doping system for adding a powder plasma catalyst to a plasma cavity for igniting, modulating, or sustaining a plasma in a cavity consistent with this invention.

In one embodiment, the powder catalyst can be carried into the cavity and at least temporarily suspended with a carrier gas. The carrier gas can be the same or different from the gas that forms the doping plasma. Also, the powder can be added to the gas prior to being introduced to the cavity. For example, as shown in FIG. 1A, electromagnetic radiation source 52 can supply radiation to electromagnetic radiation cavity 55, in which plasma cavity 60 is placed. Powder source 65 provides catalytic powder 70 into gas stream 75. In an alternative embodiment, powder 70 can be first added to cavity 60 in bulk (e.g., in a pile) and then distributed in the cavity in any number of ways, including flowing a gas through or over the bulk powder. In addition, the powder can be added to the gas for igniting, modulating, or sustaining a doping plasma by moving, conveying, drizzling, sprinkling, blowing, or otherwise, feeding the powder into or within the cavity.

In one experiment, a doping plasma was ignited in a cavity by placing a pile of carbon fiber powder in a copper pipe that extended into the cavity. Although sufficient electromagnetic (microwave) radiation was directed into the cavity, the copper pipe shielded the powder from the radiation and no plasma ignition took place. However, once a carrier gas began flowing through the pipe, forcing the powder out of the pipe and into the cavity, and thereby subjecting the powder to the electromagnetic radiation, a plasma was nearly instantaneously ignited in the cavity.

A powder plasma catalyst consistent with this invention can be substantially non-combustible, thus it need not contain oxygen, or burn in the presence of oxygen. Thus, as mentioned above, the catalyst can include a metal, carbon, a carbon-based alloy, a carbon-based composite, an electrically conductive polymer, a conductive silicone elastomer, a polymer nanocomposite, an organic-inorganic composite, and any combination thereof.

Also, powder catalysts can be substantially uniformly distributed in the plasma cavity (e.g., when suspended in a gas), and plasma ignition can be precisely controlled within the cavity. Uniform ignition can be important in certain applications, including those applications requiring brief plasma exposures, such as in the form of one or more bursts. Still, a certain amount of time can be required for a powder catalyst to distribute itself throughout a cavity, especially in complicated, multi-chamber cavities. Therefore, consistent with another aspect of this invention, a powder catalyst can be introduced into the cavity through a plurality of ignition ports to more rapidly obtain a more uniform catalyst distribution therein (see below).

In addition to powder, a passive plasma catalyst consistent with this invention can include, for example, one or more microscopic or macroscopic fibers, sheets, needles, threads, strands, filaments, yarns, twines, shavings, slivers, chips, woven fabrics, tape, whiskers, or any combination thereof. In these cases, the plasma catalyst can have at least one portion with one physical dimension substantially larger than another physical dimension. For example, the ratio between at least two orthogonal dimensions should be at least about 1:2, but could be greater than about 1:5, or even greater than about 1:10.

Thus, a passive plasma catalyst can include at least one portion of material that is relatively thin compared to its length. A bundle of catalysts (e.g., fibers) may also be used and can include, for example, a section of graphite tape. In one experiment, a section of tape having approximately thirty thousand strands of graphite fiber, each about 2-3 microns in diameter, was successfully used. The number of fibers in and the length of a bundle are not critical to igniting, modulating, or sustaining the plasma. For example, satisfactory results have been obtained using a section of graphite tape about one-quarter inch long. One type of carbon fiber that has been successfully used consistent with this invention is sold under the trademark Magnamite®, Model No. AS4C-GP3K, by the Hexcel Corporation of Salt Lake City, Utah. Also, silicon-carbide fibers have been successfully used.

A passive plasma catalyst consistent with another aspect of this invention can include one or more portions that are, for example, substantially spherical, annular, pyramidal, cubic, planar, cylindrical, rectangular or elongated.

The passive plasma catalysts discussed above include at least one material that is at least electrically semi-conductive. In one embodiment, the material can be highly conductive. For example, a passive plasma catalyst consistent with this invention can include a metal, an inorganic material, carbon, a carbon-based alloy, a carbon-based composite, an electrically conductive polymer, a conductive silicone elastomer, a polymer nanocomposite, an organic-inorganic composite, or any combination thereof. Some of the possible inorganic materials that can be included in the plasma catalyst include carbon, silicon carbide, molybdenum, platinum, tantalum, tungsten, carbon nitride, and aluminum, although other electrically conductive inorganic materials are believed to work just as well.

In addition to one or more electrically conductive materials, a passive plasma catalyst consistent with this invention can include one or more additives (which need not be electrically conductive). As used herein, the additive can include any material that a user wishes to add to the plasma. For example, as discussed in greater detail below, one or more dopants can be added to the plasma through the catalyst for doping semiconductors and other materials. The catalyst can include the dopant itself, or it can include a precursor material that, upon decomposition, can form the dopant. Thus, the plasma catalyst can include one or more additives and one or more electrically conductive materials in any desirable ratio, depending on the ultimate desired composition of the plasma and the process using the plasma.

The ratio of the electrically conductive components to the additives in a passive plasma catalyst can vary over time while being consumed. For example, during ignition, the plasma catalyst could desirably include a relatively large percentage of electrically conductive components to improve the ignition conditions. On the other hand, if used while sustaining the doping plasma, the catalyst could include a relatively large percentage of additives or dopant materials. It will be appreciated by those of ordinary skill in the art that the component ratio of the plasma catalyst used to ignite and sustain the plasma could be the same and that the ratio can be customized to convey any desired doping composition.

A predetermined ratio profile can be used to simplify many plasma-assisted doping processes. In some conventional processes, the components within the plasma are added as necessary, but such addition normally requires programmable equipment to add the components according to a predetermined schedule. However, consistent with this invention, the ratio of components in the catalyst can be varied, and thus the ratio of components in the plasma itself can be automatically varied. That is, the ratio of components in the plasma at any particular time can depend on which of the catalyst portions is currently being consumed by the plasma. Thus, the catalyst component ratio can be different at different locations within the catalyst. And, the current ratio of components in a plasma can depend on the portions of the catalyst currently and/or previously consumed, especially when the flow rate of a gas passing through the plasma chamber is relatively slow.

Figure 2:
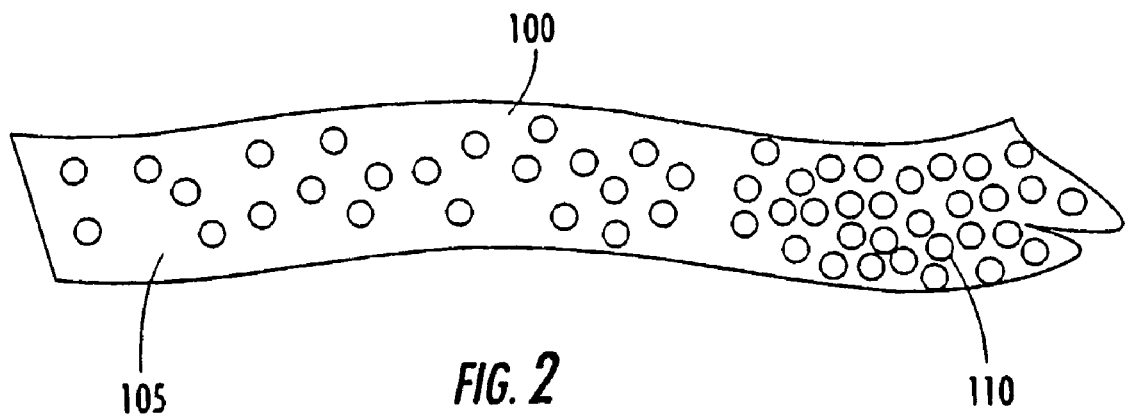
FIG. 2 shows an illustrative plasma catalyst fiber with at least one component having a concentration gradient along its length consistent with this invention.

A passive plasma catalyst consistent with this invention can be homogeneous, inhomogeneous, or graded. Also, the plasma catalyst component ratio can vary continuously or discontinuously throughout the catalyst. For example, in FIG. 2, the ratio can vary smoothly forming a gradient along a length of catalyst 100. Catalyst 100 can include a strand of material that includes a relatively low concentration of a component at section 105 and a continuously increasing concentration toward section 110.

Figure 3:
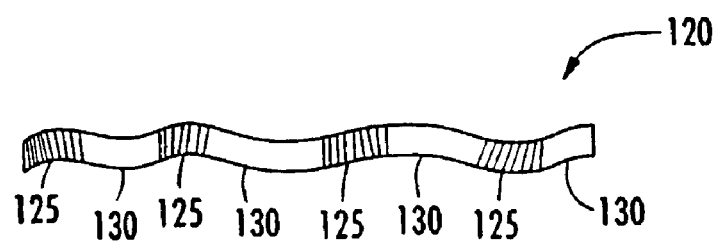
FIG. 3 shows an illustrative plasma catalyst fiber with multiple components at a ratio that varies along its length consistent with this invention.

Alternatively, as shown in FIG. 3, the ratio can vary discontinuously in each portion of catalyst 120, which includes, for example, alternating sections 125 and 130 having different concentrations. It will be appreciated that catalyst 120 can have more than two section types. Thus, the catalytic component ratio being consumed by the plasma can vary in any predetermined fashion. In one embodiment, when the plasma is monitored and a particular additive is detected, further processing can be automatically commenced or terminated.

Another way to vary the ratio of components in a sustained plasma is by introducing multiple catalysts having different component ratios at different times or different rates. For example, multiple catalysts can be introduced at approximately the same location or at different locations within the cavity. When introduced at different locations, the plasma formed in the cavity can have a component concentration gradient determined by the locations of the various catalysts. Thus, an automated system can include a device by which a consumable plasma catalyst is mechanically inserted before and/or during plasma igniting, modulating, and/or sustaining.

Figure 4:
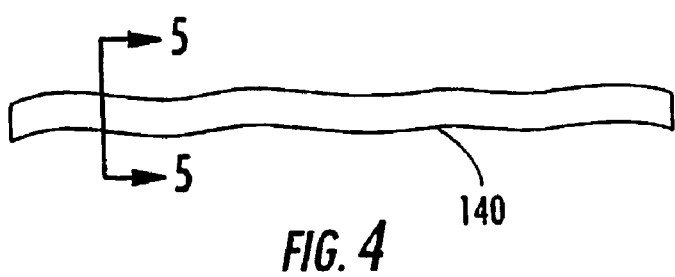
FIG. 4 shows another illustrative plasma catalyst fiber that includes a core under layer and a coating consistent with this invention.
Figure 5:
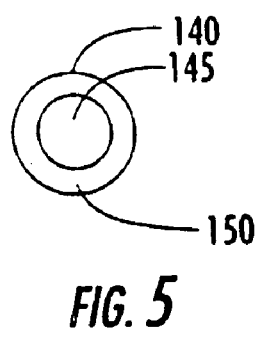
FIG. 5 shows a cross-sectional view of the plasma catalyst fiber of FIG. 4, taken from line 5-5 of FIG. 4, consistent with this invention.

A passive plasma catalyst consistent with this invention can also be coated. In one embodiment, a catalyst can include a substantially non-electrically conductive coating deposited on the surface of a substantially electrically conductive material. Alternatively, the catalyst can include a substantially electrically conductive coating deposited on the surface of a substantially electrically non-conductive material. FIGS. 4 and 5, for example, show fiber 140, which includes under layer 145 and coating 150. In one embodiment, a plasma catalyst including a carbon core can be coated with nickel to prevent oxidation of the carbon.

A single plasma catalyst can also include multiple coatings. If the coatings are consumed during contact with the plasma, the coatings could be introduced into the plasma sequentially, from the outer coating to the innermost coating, thereby creating a time-release mechanism. Thus, a coated plasma catalyst can include any number of materials, as long as a portion of the catalyst is at least electrically semi-conductive.

Consistent with another embodiment of this invention, a plasma catalyst can be located entirely within an electromagnetic radiation chamber to substantially reduce or prevent electromagnetic radiation energy leakage. In this way, the plasma catalyst does not electrically or magnetically couple with the vessel containing the cavity or to any electrically conductive object outside the cavity. This prevents sparking at the ignition port and prevents electromagnetic radiation from leaking outside the chamber during the ignition and possibly later if the plasma is sustained. In one embodiment, the catalyst can be located at a tip of a substantially electrically non-conductive extender that extends through an ignition port.

Figure 6:
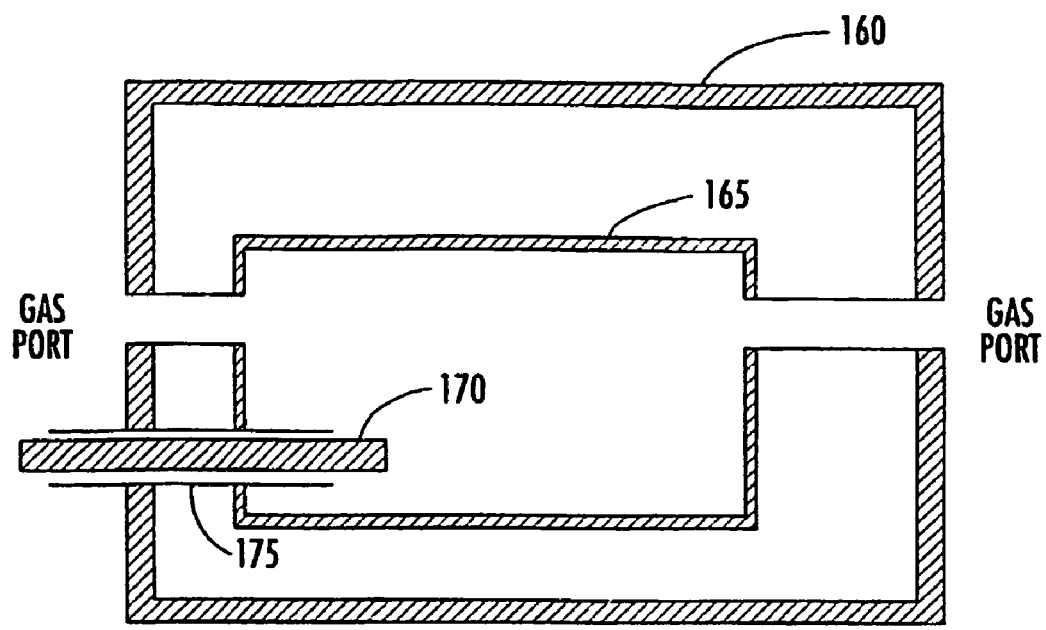
FIG. 6 shows an illustrative embodiment of another portion of a plasma system including an elongated plasma catalyst that extends through an ignition port consistent with this invention.
Figure 7:
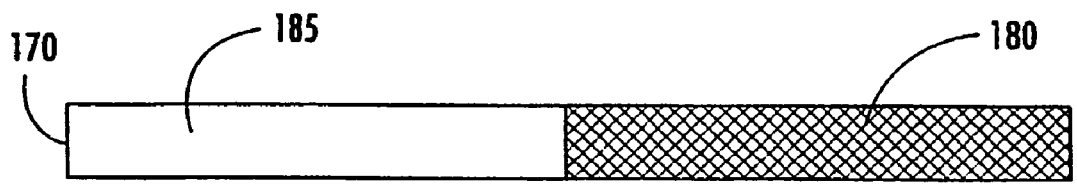
FIG. 7 shows an illustrative embodiment of an elongated plasma catalyst that can be used in the system of FIG. 6 consistent with this invention.

FIG. 6, for example, shows electromagnetic radiation chamber 160 in which plasma cavity 165 can be placed. Plasma catalyst 170 can be elongated and extends through ignition port 175. As shown in FIG. 7, and consistent with this invention, catalyst 170 can include electrically conductive distal portion 180 (which is placed in chamber 160) and electrically non-conductive portion 185 (which is placed substantially outside chamber 160). This configuration prevents an electrical connection (e.g., sparking) between distal portion 180 and chamber 160.

Figure 8:
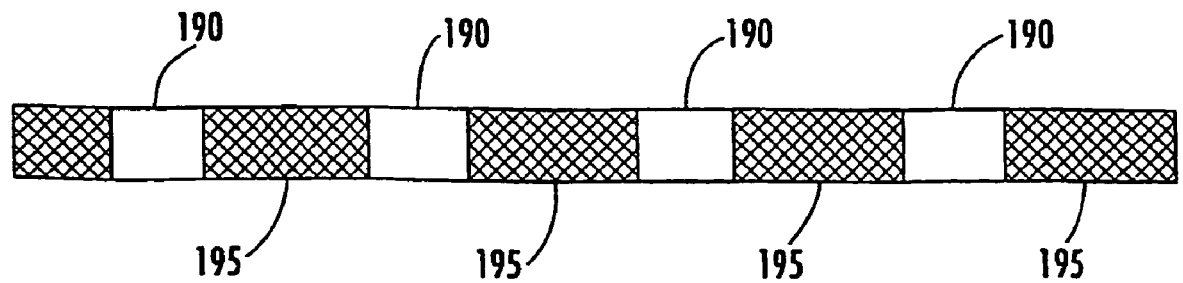
FIG. 8 shows another illustrative embodiment of an elongated plasma catalyst that can be used in the system of FIG. 6 consistent with this invention.

In another embodiment, shown in FIG. 8, the catalyst can be formed from a plurality of electrically conductive segments 190 separated by and mechanically connected to a plurality of electrically non-conductive segments 195. In this embodiment, the catalyst can extend through the ignition port between a point inside the cavity and another point outside the cavity, but the electrically discontinuous profile significantly prevents sparking and energy leakage.

Another method of forming a doping plasma consistent with this invention includes subjecting a gas in a cavity to electromagnetic radiation having a frequency less than about 333 GHz in the presence of an active plasma catalyst, which generates or includes at least one ionizing particle.

An active plasma catalyst consistent with this invention can be any particle or high energy wave packet capable of transferring a sufficient amount of energy to a gaseous atom or molecule to remove at least one electron from the gaseous atom or molecule in the presence of electromagnetic radiation. Depending on the source, the ionizing particles can be directed into the cavity in the form of a focused or collimated beam, or they may be sprayed, spewed, sputtered, or otherwise introduced.

Figure 9:
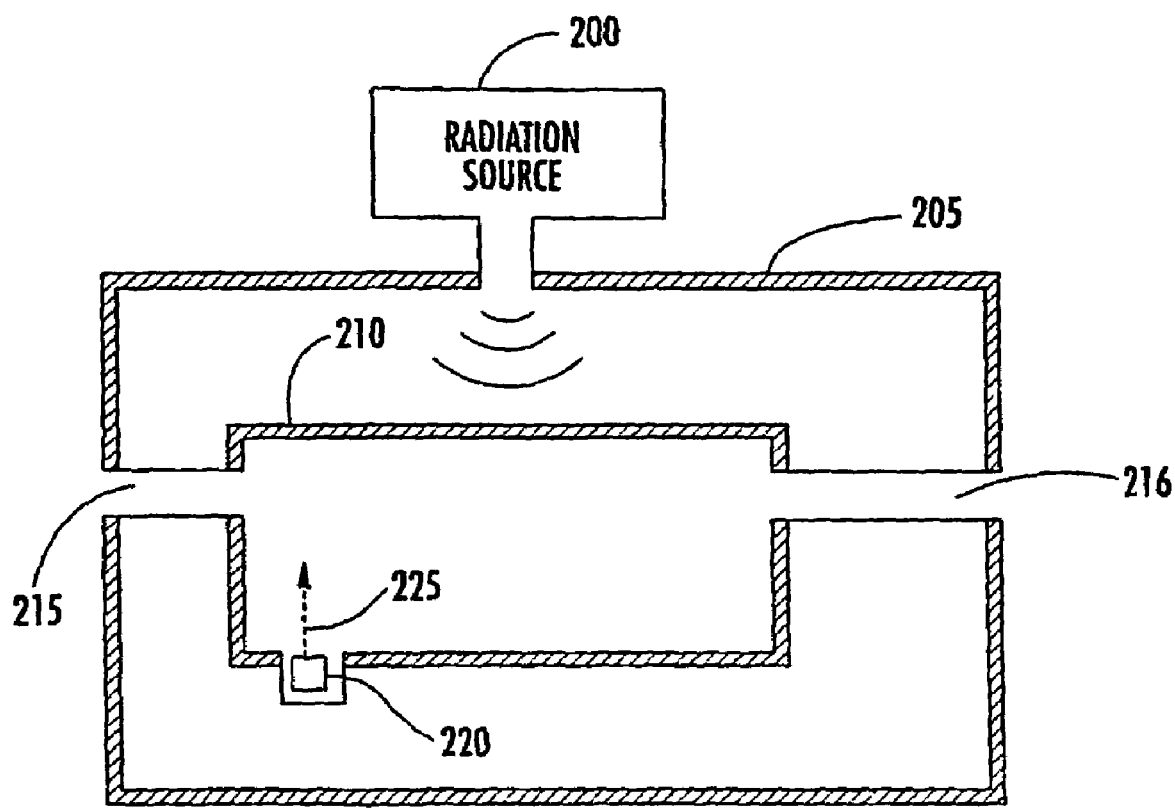
FIG. 9 shows an illustrative embodiment of a portion of a plasma-assisted doping system for directing an active plasma catalyst, in the form of ionizing radiation, into a radiation chamber consistent with this invention.

For example, FIG. 9 shows electromagnetic radiation source 200 directing radiation into electromagnetic radiation chamber 205. Plasma cavity 210 is positioned inside of chamber 205 and may permit a gas to flow therethrough via ports 215 and 216. Source 220 directs ionizing particles 225 into cavity 210. Source 220 can be protected by a metallic screen which allows the ionizing particles to go through, but shields source 220 from electromagnetic radiation. If necessary, source 220 can be water-cooled.

Examples of ionizing particles consistent with this invention can include x-ray particles, gamma ray particles, alpha particles, beta particles, neutrons, protons, and any combination thereof. Thus, an ionizing particle catalyst can be charged (e.g., an ion from an ion source) or uncharged and can be the product of a radioactive fission process. In one embodiment, the vessel in which the plasma cavity is formed could be entirely or partially transmissive to the ionizing particle catalyst. Thus, when a radioactive fission source is located outside the cavity, the source can direct the fission products through the vessel to ignite the plasma. The radioactive fission source can be located inside the electromagnetic radiation chamber to substantially prevent the fission products (i.e., the ionizing particle catalyst) from creating a safety hazard.

In another embodiment, the ionizing particle can be a free electron, but it need not be emitted in a radioactive decay process. For example, the electron can be introduced into the cavity by energizing the electron source (such as a metal), such that the electrons have sufficient energy to escape from the source. The electron source can be located inside the cavity, adjacent the cavity, or even in the cavity wall. It will be appreciated by those of ordinary skill in the art that the any combination of electron sources is possible. A common way to produce electrons is to heat a metal, and these electrons can be further accelerated by applying an electric field.

In addition to electrons, free energetic protons can also be used to catalyze a plasma. In one embodiment, a free proton can be generated by ionizing hydrogen and, optionally, accelerated with an electric field.

Multi-mode Electromagnetic Radiation Cavities

Electromagnetic radiation waveguides, cavities, and chambers can be designed to support or facilitate propagation of at least one electromagnetic radiation mode. As used herein, the term "mode" refers to a particular pattern of any standing or propagating electromagnetic wave that satisfies Maxwell's equations and the applicable boundary conditions (e.g., of the cavity). In a waveguide, or cavity, the mode can be any one of the various possible patterns of propagating or standing electromagnetic fields. Each mode is characterized by its frequency and polarization of the electric field and/or magnetic field vectors. The electromagnetic field pattern of a mode depends on the frequency, refractive indices or dielectric constants, and waveguide or cavity geometry.

A transverse electric (TE) mode is one whose electric field vector is normal to the direction of propagation. Similarly, a transverse magnetic (TM) mode is one whose magnetic field vector is normal to the direction of propagation. A transverse electric and magnetic (TEM) mode is one whose electric and magnetic field vectors are both normal to the direction of propagation. A hollow metallic waveguide does not typically support a normal TEM mode of electromagnetic radiation propagation. Even though electromagnetic radiation appears to travel along the length of a waveguide, it may do so only by reflecting off the inner walls of the waveguide at some angle. Hence, depending upon the propagation mode, the electromagnetic radiation may have either some electric field component or some magnetic field component along the axis of the waveguide (often referred to as the z-axis).

The actual field distribution inside a cavity or waveguide is a superposition of the modes therein. Each of the modes can be identified with one or more subscripts (e.g., $TE_{10}$ ("tee ee one zero"). The subscripts normally specify how many "half waves" at the guide wavelength are contained in the x and y directions. It will be appreciated by those skilled in the art that the guide wavelength can be different from the free space wavelength because electromagnetic radiation propagates inside the waveguide by reflecting at some angle from the inner walls of the waveguide. In some cases, a third subscript can be added to define the number of half waves in the standing wave pattern along the z-axis.

For a given electromagnetic radiation frequency, the size of the waveguide can be selected to be small enough so that it can support a single propagation mode. In such a case, the system is called a single-mode system (i.e., a single-mode applicator). The $TE_{10}$ mode is usually dominant in a rectangular single-mode waveguide.

As the size of the waveguide (or the cavity to which the waveguide is connected) increases, the waveguide or applicator can sometimes support additional higher order modes forming a multi-mode system. When many modes are capable of being supported simultaneously, the system is often referred to as highly moded.

A simple, single-mode system has a field distribution that includes at least one maximum and/or minimum. The magnitude of a maximum largely depends on the amount of electromagnetic radiation supplied to the system. Thus, the field distribution of a single mode system is strongly varying and substantially non-uniform.

Unlike a single-mode cavity, a multi-mode cavity can support several propagation modes simultaneously, which, when superimposed, results in a complex field distribution pattern. In such a pattern, the fields tend to spatially smear and, thus, the field distribution usually does not show the same types of strong minima and maxima field values within the cavity. In addition, as explained more fully below, a mode-mixer can be used to "stir" or "redistribute" modes (e.g., by mechanical movement of an electromagnetic radiation reflector). This redistribution desirably provides a more uniform time-averaged field distribution within the cavity.

A multi-mode cavity consistent with this invention can support at least two modes, and may support many more than two modes. Each mode has a maximum electric field vector. Although there may be two or more modes, one mode may be dominant and has a maximum electric field vector magnitude that is larger than the other modes. As used herein, a multi-mode cavity may be any cavity in which the ratio between the first and second mode magnitudes is less than about 1:10, or less than about 1:5, or even less than about 1:2. It will be appreciated by those of ordinary skill in the art that the smaller the ratio, the more distributed the electric field energy between the modes, and hence the more distributed the electromagnetic radiation energy is in the cavity.

The distribution of a doping plasma within a cavity may strongly depend on the distribution of the applied electromagnetic radiation. For example, in a pure single mode system, there may only be a single location at which the electric field is a maximum. Therefore, a strong plasma may only form at that single location. In many applications, such a strongly localized plasma could undesirably lead to non-uniform plasma treatment or heating (i.e., localized overheating and underheating).

Whether or not a single or multi-mode cavity is used to dope consistent with this invention, it will be appreciated by those of ordinary skill in the art that the cavity in which the plasma is formed can be completely closed or partially open. In other applications, however, it may be desirable to flow a gas through the cavity, and therefore the cavity must be open to some degree. In this way, the flow, type, and pressure of the flowing gas can be varied over time. This may be desirable because certain gases with lower ionization potentials, such as argon, are easier to ignite but may have other undesirable properties during subsequent plasma processing.

Mode-mixing

For many doping applications, a cavity containing a uniform plasma is desirable. However, because electromagnetic radiation can have a relatively long wavelength (e.g., in the case of microwave radiation, several tens of centimeters), obtaining a uniform distribution can be difficult to achieve. As a result, consistent with one aspect of this invention, the radiation modes in a multi-mode cavity can be mixed, or redistributed, over a period of time. Because the field distribution within the cavity must satisfy all of the boundary conditions set by the inner surface of the cavity, those field distributions can be changed by changing the position of any portion of that inner surface.

In one embodiment consistent with this invention, a movable reflective surface can be located inside the electromagnetic radiation cavity. The shape and motion of the reflective surface should, when combined, change the inner surface of the cavity during motion. For example, an "L" shaped metallic object (i.e., "mode-mixer") when rotated about any axis will change the location or the orientation of the reflective surfaces in the cavity and therefore change the electromagnetic radiation distribution therein. Any other asymmetrically shaped object can also be used (when rotated), but symmetrically shaped objects can also work, as long as the relative motion (e.g., rotation, translation, or a combination of both) causes some change in the location or orientation of the reflective surfaces. In one embodiment, a mode-mixer can be a cylinder that can be rotated about an axis that is not the cylinder's longitudinal axis.

Each mode of a multi-mode cavity may have at least one maximum electric field vector, but each of these vectors could occur periodically across the inner dimension of the cavity. Normally, these maxima are fixed, assuming that the frequency of the electromagnetic radiation does not change. However, by moving a mode-mixer such that it interacts with the electromagnetic radiation, it is possible to move the positions of the maxima. For example, mode-mixer 38 can be used to optimize the field distribution within cavity 12 such that the plasma ignition conditions and/or the plasma sustaining conditions are optimized. Thus, once a plasma is excited, the position of the mode-mixer can be changed to move the position of the maxima for a uniform time-averaged plasma process (e.g., heating).

Thus, consistent with this invention, mode-mixing can be useful during doping plasma ignition. For example, when an electrically conductive fiber is used as a plasma catalyst, it is known that the fiber's orientation can strongly affect the minimum plasma-ignition conditions. It has been reported, for example, that when such a fiber is oriented at an angle that is greater than 60° to the electric field, the catalyst does little to improve, or relax, these conditions. By moving a reflective surface either in or near the cavity, however, the electric field distribution can be significantly changed.

Mode-mixing can also be achieved by launching the radiation into the applicator chamber through, for example, a rotating waveguide joint that can be mounted inside the applicator chamber. The rotary joint can be mechanically moved (e.g., rotated) to effectively launch the radiation in different directions in the radiation chamber. As a result, a changing field pattern can be generated inside the applicator chamber.

Mode-mixing can also be achieved by launching radiation in the radiation chamber through a flexible waveguide. In one embodiment, the waveguide can be mounted inside the chamber. In another embodiment, the waveguide can extend into the chamber. The position of the end portion of the flexible waveguide can be continually or periodically moved (e.g., bent) in any suitable manner to launch the radiation (e.g., microwave radiation) into the chamber at different directions and/or locations. This movement can also result in mode-mixing and facilitate more uniform plasma processing (e.g., heating) on a time-averaged basis. Alternatively, this movement can be used to optimize the location of a plasma for ignition or other plasma-assisted process, such as doping.

If the flexible waveguide is rectangular, for example, a simple twisting of the open end of the waveguide will rotate the orientation of the electric and the magnetic field vectors in the radiation inside the applicator chamber. Then, a periodic twisting of the waveguide can result in mode-mixing as well as rotating the electric field, which can be used to assist ignition, modulation, or sustaining of a plasma.

Thus, even if the initial orientation of the catalyst is perpendicular to the electric field, the redirection of the electric field vectors can change the ineffective orientation to a more effective one. Those skilled in the art will appreciate that mode-mixing can be continuous, periodic, or preprogrammed.

In addition to plasma ignition, mode-mixing can be useful during subsequent plasma processing, such as doping, to reduce or create (e.g., tune) "hot spots" in the chamber. When an electromagnetic radiation cavity only supports a small number of modes (e.g., less than 5), one or more localized electric field maxima can lead to "hot spots" (e.g., within cavity 12). In one embodiment, these hot spots could be configured to coincide with one or more separate, but simultaneous, plasma ignitions or doping processes. Thus, in one embodiment, a plasma catalyst can be located at one or more of those ignition or doping positions.

Multi-location Plasma Ignition

A doping plasma can be ignited using multiple plasma catalysts at different locations. In one embodiment, multiple fibers can be used to ignite the plasma at different points within the cavity. Such multi-point ignition can be especially beneficial when a uniform plasma ignition is desired. For example, when a doping plasma is modulated at a high frequency (i.e., tens of Hertz and higher), or ignited in a relatively large volume, or both, substantially uniform instantaneous striking and re-striking of the plasma can be improved.

Alternatively, when plasma catalysts are used at multiple points, they can be used to sequentially ignite a plasma at different locations within a plasma chamber by selectively introducing the catalyst at those different locations. In this way, a plasma ignition gradient can be controllably formed within the cavity, if desired.

Also, in a multi-mode cavity, random distribution of the catalyst throughout multiple locations in the cavity increases the likelihood that at least one of the fibers, or any other passive plasma catalyst consistent with this invention, is optimally oriented with the electric field lines. Still, even where the catalyst is not optimally oriented (not substantially aligned with the electric field lines), the ignition conditions are improved.

Furthermore, because a catalytic powder can be suspended in a gas, it is believed that each powder particle may have the effect of being placed at a different physical location within the cavity, thereby improving ignition uniformity within the cavity.

Dual-Cavity Plasma Igniting/Sustaining

Figure 10:
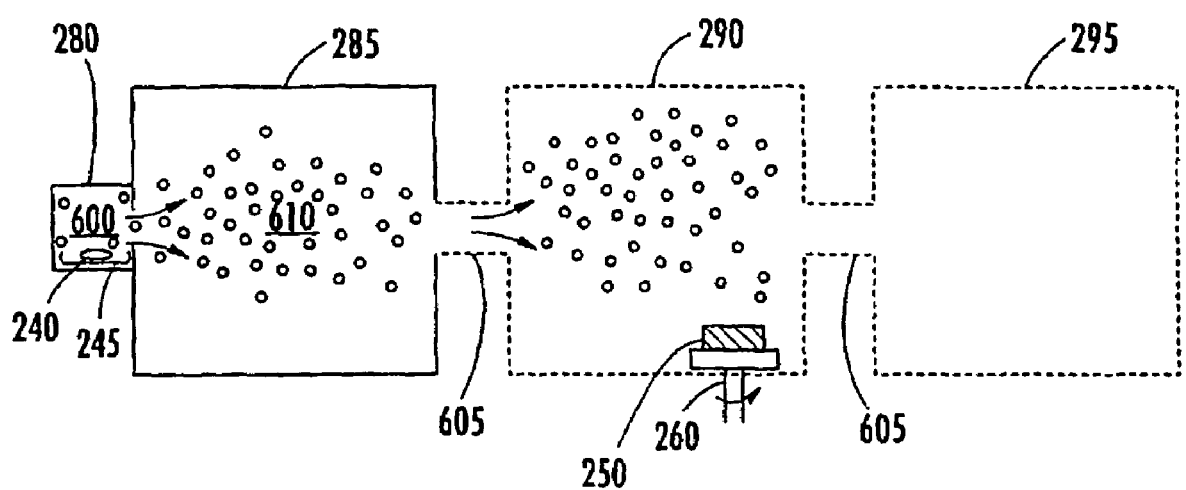
FIG. 10 shows an illustrative embodiment of a portion of the plasma-assisted doping system shown in FIG. 1 with additional optional plasma chambers consistent with this invention.

A dual-cavity arrangement can be used to ignite and sustain a plasma consistent with this invention. In one embodiment, a system includes at least ignition cavity 280 and plasma processing (e.g., doping) cavity 285 in fluid communication with each other, for example, as shown in FIG. 10. Cavities 280 and 285 can be located, for example, inside electromagnetic radiation chamber (i.e., applicator) 14, as shown in FIG. 1.

To form an ignition plasma, a gas in first ignition cavity 280 can be subjected to electromagnetic radiation having a frequency less than about 333 GHz, optionally in the presence of a plasma catalyst. In this way, the proximity of the first and second cavities can permit plasma 600, formed in cavity 280, to ignite plasma 610 in cavity 285, which may be sustained with additional electromagnetic radiation. Additional cavities 290 and 295 are optional, and can be kept in fluid communication with cavity 285 by channel 605, for example. A semiconductor, for example, to be doped, such as substrate 250, can be placed in any of cavities 285, 290, or 295 and can be supported by any type of supporting device, such as support 260, which optionally moves or rotates substrate 250 during the doping procedure.

In one embodiment of this invention, cavity 280 can be very small and designed primarily, or solely for plasma ignition. In this way, very little electromagnetic radiation energy may be required to ignite plasma 600, permitting easier ignition, especially when a plasma catalyst is used consistent with this invention. It will also be appreciated that the cavities used in the plasma system consistent with the present invention can have a variable size, and a dopant controller can be used to control the size of the cavity.

In one embodiment, cavity 280 can be a substantially single mode cavity and cavity 285 can be a multi-mode cavity. When cavity 280 only supports a single mode, the electric field distribution may strongly vary within the cavity, forming one or more precisely located electric field maxima. Such maxima are normally the first locations at which plasmas ignite, making them ideal points for placing plasma catalysts. It will be appreciated, however, that when a plasma catalyst is used to ignite plasma 600, the catalyst need not be placed in the electric field maximum and, many cases, need not be oriented in any particular direction.

Illustrative Doping Methods and Apparatus

FIGS. 11-14 show various illustrative embodiments of methods and apparatus that can be used to dope substrates consistent with this invention. FIG. 10, already described above, shows how a dual-cavity system can be used to ignite a plasma in one chamber and form a doping plasma in another. FIG. 10 also shows how additional chambers can be added sequentially, if desired.

Figure 11:
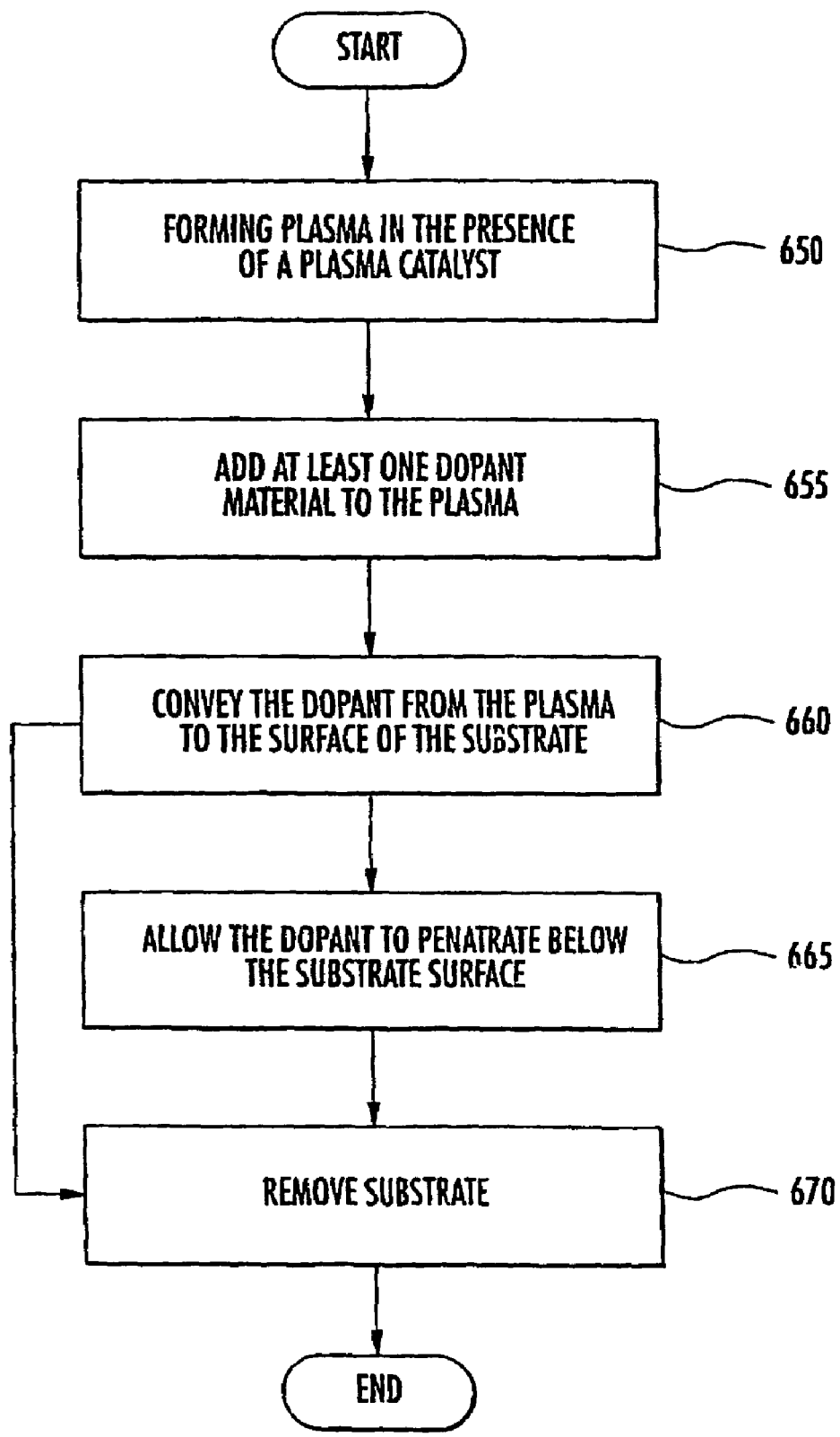
FIG. 11 shows an illustrative embodiment of a method of doping a semiconductor substrate consistent with the present invention.

FIG. 11 shows a flow chart of an illustrative plasma-assisted doping method using a catalyzed doping plasma. Consistent with this method, a plasma can be formed in step 650 in the presence of a plasma catalyst, such as by subjecting a gas to electromagnetic radiation in the presence of the catalyst.

In step 655, at least one dopant material can be added to the plasma. A dopant material can be a precursor to the final dopant, or the dopant itself. For example, certain precursor dopant materials, such as $POCl_3$ or $PH_3$, can be introduced to the plasma in the form of a gas, a liquid, or a solid, such as a powder. These precursors can then be decomposed in the plasma, leaving P, in the example above, to achieve an n-type doping of a substrate. Similarly, $Al_2O_3$ can be introduced into the plasma as a powder, and decomposed by the plasma, leaving Al, to achieve a p-type doping of a substrate.

In addition, dopant materials can be introduced into the plasma in their final form. For example, B, Al, or even liquid Ga, can be introduced into the plasma to form p-type dopants in substrate 250. Similarly, $N_2$ or As can be introduced into the plasma to form n-type dopants in the substrate. One skilled in the art will appreciate that the dopant materials and precursors described above are not the only possible dopants and precursors. Also consistent with this invention are other n-type and p-type dopants and precursors, such as Al, $AsH_2$, $AsH_3$, $Cl_2$, Ga, Ge, $H_2S$, P, $PH_3$, $PF_6$, $SiF_4$, Si, Se, Te, Sb, B, Bi, C, Zn, $BCl_3$, $BF_3$, $B_{11}F_3$, $B_2H_6$. The plasma can also be modulated or sustained using any convenient carrier gas, such as Ar, $H_2$, He, $N_2$, $O_2$, etc.

Next, after the addition of at least one dopant material to the plasma in step 655, the dopant material can be conveyed from the plasma to the surface of a substrate in step 660. Once the dopant is conveyed to that surface, the dopant can be allowed to penetrate below the surface of the substrate for a time period in step 665. As used herein, the term "penetration time period" refers to the period of time during which dopants are capable of substantially penetrating into the substrate. Penetration can be largely stopped, for example, if the temperature of the substrate is sufficiently lowered. The penetration time period can occur at the same time that the dopant material is conveyed from the plasma to the surface of a substrate in step 660.

After conveyance in step 660 or penetration in step 665, the substrate can be removed from the plasma in step 670. One skilled in the art will appreciate the substrate can be, for example, a semiconductor (e.g., an elemental semiconductor such as, C, Ge, Si, α-Sn (gray tin), P, Se, Te, etc. or a compound semiconductor, such as, GaAs, GaP, GaN, InP, SiGe, SiC, GaAsP, GaAlAs, InGaAs, InGaP, ZnSe, ZnO, HgTe, etc.). Alternatively, the substrate can be an insulating material, or an insulating material with a semiconductor layer formed thereon (e.g., silicon on insulator, "SOI"). In general, the dopant material can be any material used to affect the charge concentration and/or electron/hole mobility in the substrate.

Figure 12:
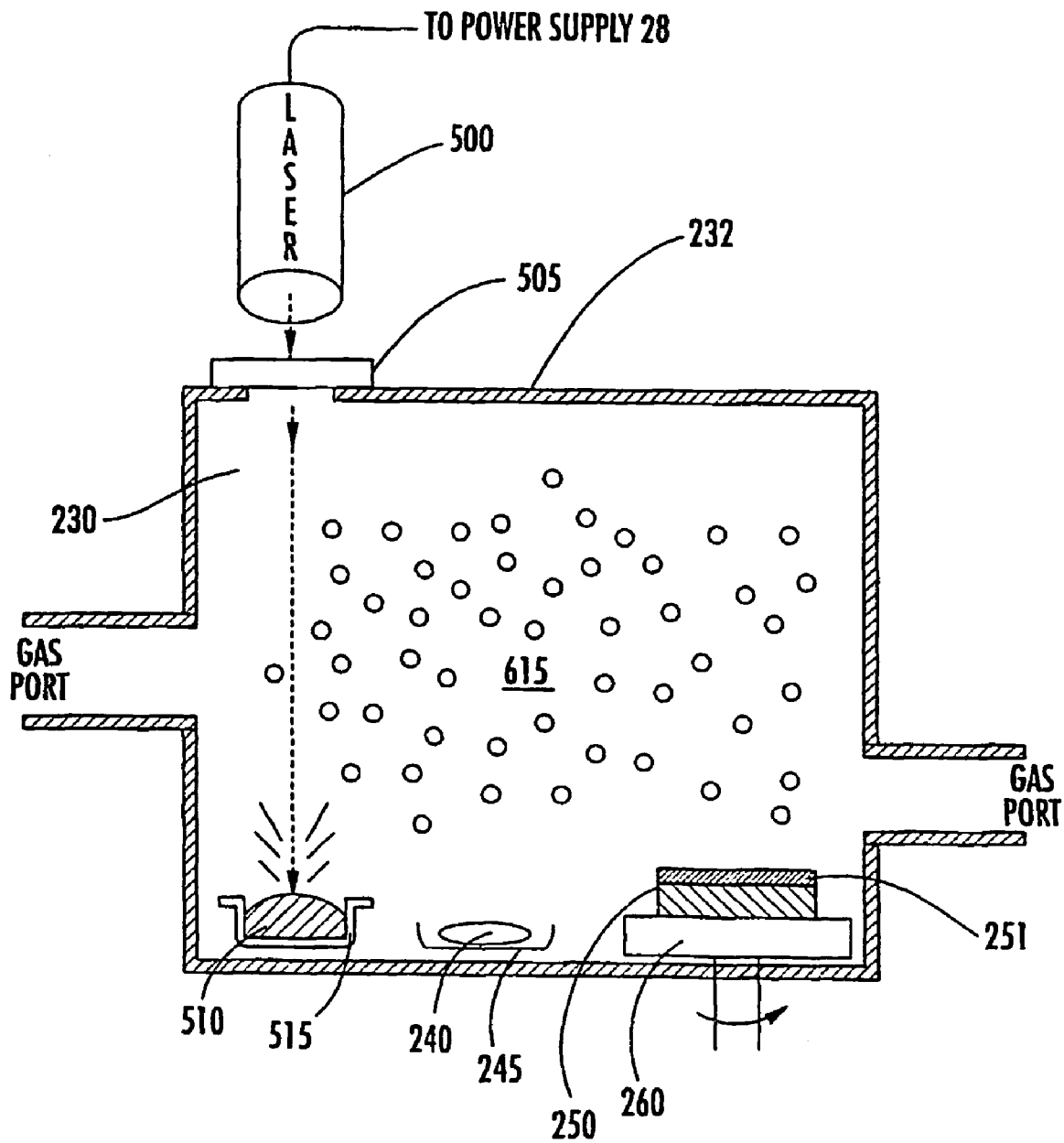
FIG. 12 shows another illustrative embodiment of a portion of the plasma-assisted doping system shown in FIG. 1 including a device for energizing a dopant material consistent with this invention.

FIG. 12 shows another illustrative plasma-assisted doping apparatus consistent with this invention, and can be used to perform the method of FIG. 11. In this apparatus, a single cavity can be used to ignite a plasma with a plasma catalyst and dope a substrate. A first surface area of substrate 250 can be doped by forming doping plasma 615 in cavity 230 by subjecting a gas to an amount of electromagnetic radiation in the presence of plasma catalyst 240, which can be located, for example, on mount 245. In addition, laser 500 can be used through optical window 505 to energize (e.g., vaporize, sublime, or sputter) dopant material 510 in crucible 515. It will be appreciated that any solid or liquid previously described (e.g., any material that will vaporize, sublime, or sputter upon exposure to laser 500) can be used as dopant material 510. It will also be appreciated that other types of energy sources, other than laser 500, can be used to energize dopant material 510, including, for example, ion beams, carrier gases, etc.

In one embodiment, laser 500 can produce a beam of light having a wavelength between about 150 nm and 20 μm, although any other convenient wavelength can also be used. Laser 500 can also be a high peak power pulsed laser beam that continually, periodically, or in a preprogrammed fashion energizes dopant material 510. A carrier gas, such as Ar (not shown), or any carrier gas described previously, can direct the energized (e.g., vaporized) dopant material toward plasma 615 to form a layer of dopant material on substrate 250. It will be appreciated that the uniformity of the dopant layer can be increased by moving (e.g., rotating) substrate 250 using support 260 (e.g., a turntable).

Thus, doping plasma 615, which can be catalyzed from a gas using plasma catalyst 240, can be enhanced by energizing doping material 510 with laser 500. It will be appreciated that although FIG. 12 shows a single cavity system, two or more cavities can be used consistent with this invention, as shown in FIG. 10.

It will be appreciated by one of ordinary skill in the art that a plasma-assisted doping system consistent with this invention can include any electronic or mechanical means for introducing a catalyst to a plasma cavity. For example, a fiber can be mechanically inserted before or during the formation of the doping plasma. It will also be appreciated that plasma 615 can also be triggered by a spark plug, pulsed laser, or even by a burning match stick introduced in cavity 230 before, during, or after the presence of electromagnetic radiation.

It will be further appreciated that dopant material 510 can be separated from plasma 615 during a doping procedure to better control the introduction of the material into the plasma. For this purpose, one or more walls or screens (not shown) can be placed between doping material 510 in crucible 515 and plasma 615. Other electromagnetic radiation or plasma shielding methods may also be used.

Plasma 615 can absorb an appropriate level of electromagnetic radiation energy to achieve any predetermined temperature profile (e.g., any selected temperature). The gas pressure in the cavity can be less than, equal to, or greater than atmospheric pressure. At least one additional doping material (not shown) can be added to plasma 615, thereby allowing it to form a multi-component or multi-layered dopant on the surface of substrate 250.

Figure 13:
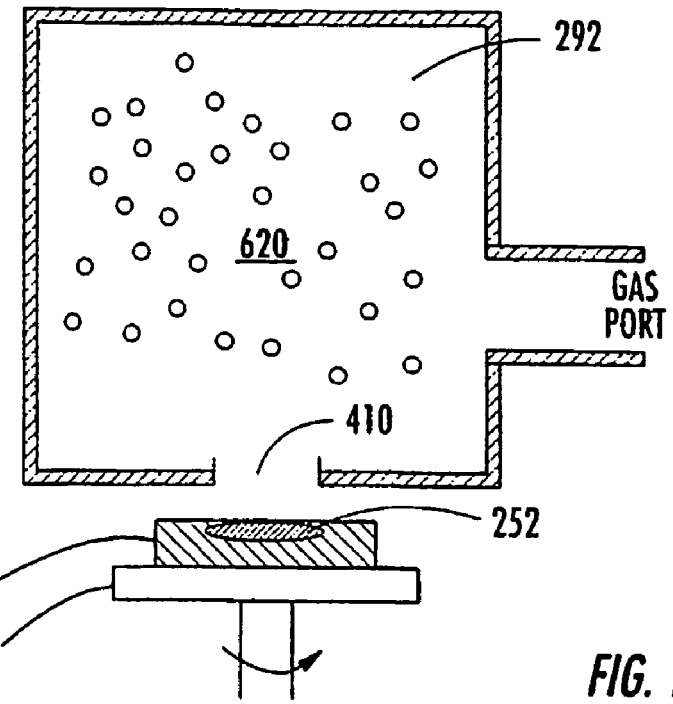
FIG. 13 shows still another illustrative embodiment of a portion of the plasma-assisted doping system shown in FIG. 1 for doping a substrate through an aperture consistent with this invention.

FIG. 13 shows another embodiment consistent with this invention where the doping process takes place outside of the doping plasma chamber. In this case, cavity 292 has aperture 410, which may be at or near the bottom of cavity 292 to help prevent plasma 620 from escaping cavity 292. It will be appreciated, however, that aperture 410 can be located at any position of cavity 292. Substrate 250 can be supported by mount 260 and optionally rotated or otherwise moved with respect to aperture 410. Plasma 620 inside cavity 292 can include one or more dopant materials that can be deposited on a surface of substrate 250.

Plasma 620 can be sustained or modulated in cavity 292 and substrate 250 can be maintained at any desirable temperature, such as a temperature substantially below that of plasma 620 to increase the deposition rate of the dopant material. Then, dopant region 252 can be formed by drive-in diffusion of the dopant material using plasma 620 as a source of heat or any other external heat source (not shown). An advantage of using plasma 620 as a source of heat is that the entire substrate need not be heated, so that drive-in diffusion can be accomplished in the situation where other temperature-sensitive components are prefabricated in the substrate. In addition, mount 260 can be heated or cooled by any external means (e.g., a heat exchanger) to keep substrate 250 at a desirable temperature. For example, a cooling fluid (e.g., gas) can be used to cool substrate 250 before, during, or after a doping process.

It will be appreciated that the dopant material passing through aperture 410 may be combined with one or more other materials or gases (not shown), inside or outside cavity 292, to achieve any desired dopant composition or doping profile.

Although igniting, modulating, or sustaining a doping plasma consistent with this invention can occur at atmospheric pressure (using, for example, a regulated flow of a carrier gas), a dopant can be deposited onto substrate 250 at any desirable pressure, including below, at, or above atmospheric pressure. Furthermore, plasma pressure and temperature can be varied as desired. For example, using a system (like the one shown in FIG. 10) allows one to modulate or sustain dopant plasma 610 at atmospheric pressure in cavity 285, and deposit a dopant on substrate 250 in another cavity (e.g., cavity 285, 290, or 295) at a pressure higher or lower than atmospheric pressure. Such flexibility can be very desirable in, for example, large scale manufacturing processes.

Figure 14:
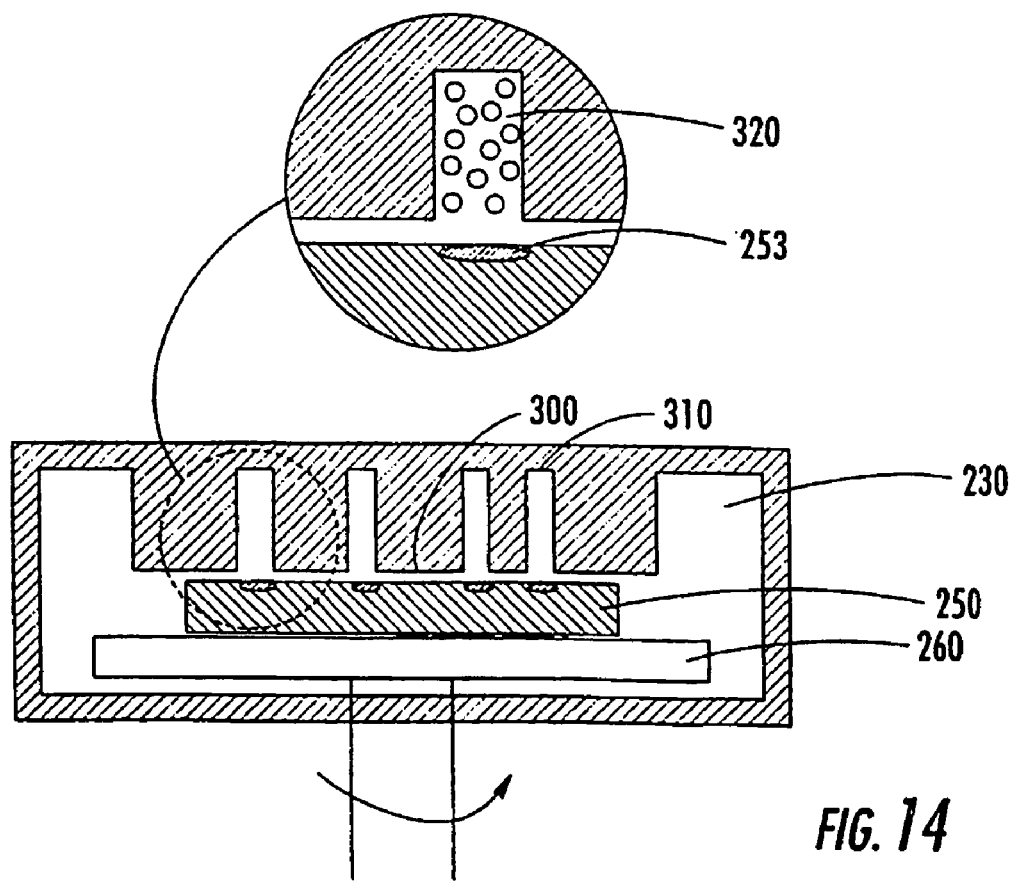
FIG. 14 shows yet another illustrative embodiment of a portion of the plasma-assisted doping system shown in FIG. 1, where the plasma cavity has internal surface features for fabricating patterned doping regions consistent with this invention.

FIG. 14 shows how an inner surface of cavity 230 can contain surface features (e.g., one or more topographical features) to form a pattern of dopant regions in substrate 250.

Doping plasma 320 can be modulated or sustained, for example, at predetermined locations above the surface of electrically conducting substrate 250 by providing a sufficient gap between that surface and the inner surface of cavity 230. For example, doping plasma 320 can be formed, and a doping material (not shown) can be deposited adjacent doping plasma 320 when the gap is at least about $\lambda/4$ (below surface 320), where $\lambda$ is the wavelength of the applied electromagnetic radiation. On the other hand, when the gap is less than $\lambda/4$ (below surface 300), little or no plasma will form and a dopant material may not be deposited. Thus, dopant region 253 can be selectively formed adjacent to plasmas, but can be selectively prevented where plasma is prevented. It will be appreciated that the pattern shown in FIG. 14 is not the only possible pattern.

Although FIG. 14 shows the inner surface of cavity 230 with raised and depressed surface features, it will also be appreciated that these features can be located on substrate 250, and the inner surface of cavity 230 can be relatively flat or smooth.

Thus, surface features present on substrate 250 can effectively act like a mask during deposition of the doping material. This "mask" can be the substrate itself, or it can be a photo resist, for example, like that used in the semiconductor industry, or it can be any other material used to alter the geometry of the dopant material deposition process (e.g., a sacrificial film designed to prevent doping adjacent to source and drain regions, for example, in a semiconductor device. Masks, for example, can be negative or positive photo resists, deposited metals, oxides, or other materials used in a permanent or sacrificial manner to effectuate a desired doped region.

An advantage of depositing dopant materials, like those described above, using this catalyzed plasma process, may include a highly selective growth rate due to the variable concentration and location of dopant species above substrate 250 during a doping process, even at relatively high pressures inside the chamber.

It will be appreciated that other single and multi-element dopant materials not discussed above can also be formed consistent with this invention.

In the foregoing described embodiments, various features are grouped together in a single embodiment for purposes of streamlining the disclosure. This method of disclosure is not to be interpreted as reflecting an intention that the claimed invention requires more features than are expressly recited in each claim. Rather, as the following claims reflect, inventive aspects lie in less than all features of a single foregoing disclosed embodiment. Thus, the following claims are hereby incorporated into this Detailed Description of Embodiments, with each claim standing on its own as a separate preferred embodiment of the invention.

We claim:

1. A method of doping a substrate using a plasma catalyst, the method comprising:
    forming a plasma in a first cavity by subjecting a gas to electromagnetic radiation having a frequency less than about 333 GHz in the presence of the plasma catalyst, wherein the cavity is formed in a vessel and said vessel has an interior surface with at least one surface feature;
    adding at least one dopant to the plasma;
    conveying the dopant from the plasma to a first surface of the substrate, wherein the conveying comprises forming at least one dopant pattern on the substrate based on the at least one surface feature; and
    allowing the at least one dopant to penetrate below the first surface into the substrate over a penetration time period.

2. The method of claim 1, wherein the plasma catalyst is at least one of an active plasma catalyst and a passive plasma catalyst.

3. The method of claim 2, wherein the plasma catalyst is the passive catalyst and comprises at least one material that is at least electrically semi-conductive.

4. The method of claim 3, wherein the material comprises at least one of metal, inorganic material, carbon, carbon-based alloy, carbon-based composite, electrically conductive polymer, conductive silicone elastomer, polymer nanocomposite, organic-inorganic composite.

5. The method of claim 4, wherein the material is in the form of at least one of a nano-particle, a nano-tube, a powder, a dust, a flake, a fiber, a sheet, a needle, a thread, a strand, a filament, a yarn, a twine, a shaving, a sliver, a chip, a woven fabric, a tape, a whisker, and any combination thereof.

6. The method of claim 2, wherein the plasma catalyst is the active catalyst and comprises at least one ionizing particle.

7. The method of claim 6, wherein the particle is at least one of an x-ray particle, a gamma ray particle, an alpha particle, a beta particle, a neutron, and a proton.

8. The method of claim 6, wherein the at least one ionizing particle is a charged particle.

9. The method of claim 6, wherein the ionizing particle comprises a radioactive fission product.

10. The method of claim 3, wherein the plasma catalyst comprises carbon fiber.

11. The method of claim 3, wherein the material comprises at least one nano-tube.

12. The method of claim 1, further comprising sustaining the plasma during at least one of the conveying and the allowing by directing a sufficient amount of electromagnetic radiation into the cavity, wherein the directing is selected from a group consisting of continuously directing, periodically directing, programmed directing, and any combination thereof.

13. The method of claim 12, further comprising controlling a temperature associated with at least one of the plasma and the substrate according to a predetermined temperature profile by varying at least one of a gas flow through the cavity and an electromagnetic radiation power level.

14. The method of claim 1, wherein the vessel comprises a material selected from a group consisting of a ceramic material, quartz, and any combination thereof, and wherein the forming comprises transmitting the electromagnetic radiation through a portion of the vessel.

15. The method of claim 1, wherein the vessel is inside an applicator comprising a material that is substantially non-transmissive to electromagnetic radiation.

16. The method of claim 15, wherein the vessel and the applicator are the same.

17. The method of claim 1, wherein the adding comprises adding donor atoms to the plasma, wherein the donor atoms have a first number of valence electrons and the substrate comprises atoms that are bonded to each other with a second number of valence electrons, and wherein the first number is different from the second number.

18. The method of claim 1, wherein the allowing comprises a penetration method selected from a group consisting of diffusing, implanting, and a combination thereof.

19. The method of claim 18, wherein the penetration method comprises implanting by accelerating the at least one dopant toward the substrate during the conveying by applying an external field to the plasma.

20. The method of claim 18, wherein the penetration method comprises diffusing by heating the substrate after the conveying.

21. The method of claim 20, wherein the heating comprises heating the substrate with a second plasma, wherein the second plasma is in thermal contact with the substrate.

22. The method of claim 21, wherein the heating comprises heating the substrate with a second plasma, wherein the first plasma and the second plasma are contiguous.

23. The method of claim 21, wherein the first plasma and the second plasma are the same.

24. The method of claim 23, wherein the at least one dopant comprises at least one of Al, $AsH_2$, $AsH_3$, $Cl_2$, Ga, Ge, $H_2S$, P, $PH_3$, $PF_6$, $SiF_4$, Si, Se, Te, Sb, B, Bi, C, Zn, $BCl_3$, $BF_3$, $B_{11}F_3$, and $B_2H_6$.

25. The method of claim 20, wherein the heating comprises heating only a portion of the substrate.

26. The method of claim 1, wherein the adding, conveying, and allowing are performed repeatedly according to a predetermined sequence to obtain a dopant concentration profile in the substrate that varies according to the predetermined sequence.

27. The method of claim 1, further comprising melting a portion of the substrate by exposing the substrate to a heating source to enhance the allowing of the at least one dopant to penetrate below the first surface into the substrate.

28. The method of claim 27, wherein the melting is performed at a time selected from a group consisting of before the conveying, during the conveying, after the conveying, and any combination thereof.

29. The method of claim 27, wherein the heating source is selected from a group consisting of a second plasma, at least one pulse from a laser beam, at least one pulse from an ion beam, and any combination thereof.

30. The method of claim 1, further comprising annealing the substrate with the plasma after the allowing.

31. The method of claim 1, wherein the at least one dopant is formed by decomposing a precursor material in the plasma.

32. The method of claim 1, wherein the vessel has an inner surface and the electromagnetic radiation has a wavelength $\lambda$, the method further comprising:
  positioning the first surface area of the substrate at a distance of at least about $\lambda/4$ from a first portion of the inner surface of the vessel; and
  positioning a second surface area of the substrate that should not be doped at a distance of less than about $\lambda/4$ from a second portion of the inner surface of the vessel.

33. The method of claim 1, further comprising a second vessel in which a second cavity is formed, wherein the substrate is located in the second cavity, and wherein the first and second cavities are connected such that the at least one dopant can flow from the first cavity to the second cavity during the conveying and to cause the allowing to occur in the second cavity.

34. The method of claim 1, wherein the vessel has an aperture, and wherein the conveying comprises flowing the at least one dopant there through to cause the allowing to occur outside the cavity.

35. The method of claim 1, wherein the substrate is at least one of a semiconductor or an oxide.

36. A system for doping a substrate using a plasma catalyst, the method comprising:
  a vessel in which a first cavity is formed and in which a plasma can be at least partially contained, said vessel having an interior surface with at least one surface feature that is structured and arranged to provide at least one dopant pattern on the substrate;
  a electromagnetic radiation source configured to supply electromagnetic radiation to the first cavity;
  at least one plasma catalyst located in the electromagnetic radiation;
  a gas source connected to the cavity for supplying a gas to the cavity, such that when the gas is exposed to the electromagnetic radiation in the presence of the plasma catalyst, the plasma is formed in the cavity; and
  at least one dopant source for doping the substrate, wherein the at least one dopant source is located in fluid communication with the first cavity.

37. The system of claim 36, wherein the plasma catalyst is located in the cavity.

38. The system of claim 37, wherein the vessel comprises a material that is substantially transmissive to electromagnetic radiation and substantially impermeable to a gas.

39. The system of claim 37, further comprising a temperature controller, wherein the controller is for controlling a temperature associated with the substrate according to a predetermined temperature profile by varying at least one of a gas flow through the cavity and an electromagnetic radiation power level.

40. The system of claim 37, further comprising a mass flow controller between the gas source and the cavity.

41. The system of claim 37, wherein the at least one dopant source comprises at least one of Al, $AsH_2$, $AsH_3$, $Cl_2$, Ga, Ge, $H_2S$, P, $PH_3$, $PF_6$, $SiF_4$, Si, Se, Te, Sb, B, Bi, C, Zn, $Bcl_3$, $BF_3$, $B_{11}F_3$, and $B_2H_6$.

42. The system of claim 36, wherein the plasma catalyst is at least one of an active plasma catalyst and a passive plasma catalyst.

43. The system of claim 42, wherein the plasma catalyst is the passive catalyst and comprises at least one material that is at least electrically semi-conductive.

44. The system of claim 43, wherein the material comprises at least one of metal, inorganic material, carbon, carbon-based alloy, carbon-based composite, electrically conductive polymer, conductive silicone elastomer, polymer nanocomposite, organic-inorganic composite.

45. The system of claim 44, wherein the material is in the form of at least one of a nano-particle, a nano-tube, a powder, a dust, a flake, a fiber, a sheet, a needle, a thread, a strand, a filament, a yarn, a twine, a shaving, a sliver, a chip, a woven fabric, a tape, a whisker, and any combination thereof.

46. The system of claim 44, wherein the plasma catalyst comprises carbon fiber.

47. The method of claim 44, wherein the material comprises at least one nano-tube.

48. The system of claim 43, wherein the plasma catalyst is the active catalyst and comprises at least one ionizing particle.

49. The system of claim 48, wherein the particle is at least one of an x-ray particle, a gamma ray particle, an alpha particle, a beta particle, a neutron, and a proton.

50. The system of claim 48, wherein the at least one ionizing particle is a charged particle.

51. The system of claim 48, wherein the ionizing particle comprises a radioactive fission product.

52. A method of doping a substrate using a plasma catalyst, the method comprising:
    forming a plasma in a first cavity by subjecting a gas to electromagnetic radiation having a frequency less than about 333 GHz in the presence of a passive plasma catalyst comprising at least one nano-tube that is at least electrically semi-conductive, wherein the cavity is formed in a vessel;
    adding at least one dopant to the plasma;
    conveying the dopant from the plasma to a first surface of the substrate; and
    allowing the at least one dopant to penetrate below the first surface into the substrate over a penetration time period.

53. A method of doping a substrate using a plasma catalyst, the method comprising:
    forming a plasma in a first cavity by subjecting a gas to electromagnetic radiation having a frequency less than about 333 GHz in the presence of the plasma catalyst, wherein the cavity is formed in a vessel having an inner surface and the electromagnetic radiation has a wavelength $\lambda$;
    adding at least one dopant to the plasma;
    conveying the dopant from the plasma to a first surface of the substrate;
    allowing the at least one dopant to penetrate below the first surface into the substrate over a penetration time period;
    positioning the first surface area of the substrate at a distance of at least about $\lambda/4$ from a first portion of the inner surface of the vessel; and
    positioning a second surface area of the substrate that should not be doped at a distance of less than about $\lambda/4$ from a second portion of the inner surface of the vessel.

54. A system for doping a substrate using a passive plasma catalyst, the method comprising:
    a vessel in which a first cavity is formed and in which a plasma can be at least partially contained;
    a electromagnetic radiation source configured to supply electromagnetic radiation to the first cavity;
    at least one passive plasma catalyst located in the electromagnetic radiation, the passive plasma catalyst comprises at least one nano-tube that is at least electrically semi-conductive;
    a gas source connected to the cavity for supplying a gas to the cavity, such that when the gas is exposed to the electromagnetic radiation in the presence of the plasma catalyst, the plasma is formed in the cavity; and
    at least one dopant source for doping the substrate, wherein the at least one dopant source is located in fluid communication with the first cavity.

* * * * *